(12) United States Patent
Rebstock

(10) Patent No.: US 10,453,722 B2
(45) Date of Patent: Oct. 22, 2019

(54) SEMICONDUCTOR STOCKER SYSTEMS AND METHODS

(71) Applicant: Brooks Automation (Germany) GmbH, Jena (DE)

(72) Inventor: Lutz Rebstock, Gaeinhofen (DE)

(73) Assignee: Brooks Automation (Germany) GmbH, Jena (DE)

( * ) Notice: Subject to any disclaimer, the term of this patent is extended or adjusted under 35 U.S.C. 154(b) by 70 days.

(21) Appl. No.: 15/383,734

(22) Filed: Dec. 19, 2016

(65) Prior Publication Data

US 2017/0162413 A1    Jun. 8, 2017

Related U.S. Application Data

(63) Continuation of application No. 13/537,016, filed on Jun. 28, 2012, now Pat. No. 9,524,892.

(Continued)

(51) Int. Cl.
*H01L 21/677*    (2006.01)
*H01L 21/673*    (2006.01)
(Continued)

(52) U.S. Cl.
CPC .......... *H01L 21/67393* (2013.01); *B65B 5/08* (2013.01); *B65B 31/04* (2013.01); *B65B 35/16* (2013.01); *B65B 63/08* (2013.01); *H01L 21/67766* (2013.01); *H01L 21/67769* (2013.01); *H01L 21/67778* (2013.01); *Y10T 74/20305* (2015.01)

(58) Field of Classification Search
CPC ........ B65B 5/08; B65B 31/04; B65B 31/047; H01L 21/67359; H01L 21/67386; H01L 21/67389; H01L 21/67393; H01L 21/67766; H01L 21/67769; H01L 21/67778; Y10S 414/14
USPC ............ 53/432; 118/728; 134/17, 18; 141/4; 414/217, 217.1, 222.02, 270, 277, 935; 438/87, 909, 949
See application file for complete search history.

(56) References Cited

U.S. PATENT DOCUMENTS 4,745,681 A    5/1988    Hollis, Jr. et al.
5,575,081 A    11/1996   Ludwig
(Continued)

FOREIGN PATENT DOCUMENTS

CN    1656368      8/2005
CN    101166681    4/2008
(Continued)

OTHER PUBLICATIONS

International Search Report, International Application No. PCT/IB/2012/053278, dated Jan. 30, 2013.

*Primary Examiner* — Saul Rodriguez
*Assistant Examiner* — Brendan P Tighe
(74) *Attorney, Agent, or Firm* — Perman & Green, LLC; Colin C. Durham

(57) ABSTRACT

In an embodiment, the present invention discloses cleaned storage processes and systems for high level cleanliness articles, such as extreme ultraviolet (EUV) reticle carriers. A decontamination chamber can be used to clean the stored workpieces. A purge gas system can be used to prevent contamination of the articles stored within the workpieces. A robot can be used to detect the condition of the storage compartment before delivering the workpiece. A monitor device can be used to monitor the conditions of the stocker.

28 Claims, 19 Drawing Sheets

Related U.S. Application Data

(60) Provisional application No. 61/501,792, filed on Jun. 28, 2011.

(51) Int. Cl.
  B65B 5/08 (2006.01)
  B65B 31/04 (2006.01)
  B65B 35/16 (2006.01)
  B65B 63/08 (2006.01)

(56) References Cited

U.S. PATENT DOCUMENTS

| | | |
|---|---|---|
| 6,042,651 A | 3/2000 | Roberson, Jr. et al. |
| 6,881,268 B2 | 4/2005 | Shinoda et al. |
| 6,901,971 B2 | 6/2005 | Speasl et al. |
| 6,981,832 B2 | 1/2006 | Zinger et al. |
| 7,077,173 B2 | 7/2006 | Tokunaga |
| 7,428,958 B2 | 9/2008 | Tanaka |
| 7,607,543 B2 | 10/2009 | Gregerson et al. |
| 7,918,122 B2 | 4/2011 | Murata et al. |
| 8,033,190 B2 | 10/2011 | Renken et al. |
| 8,070,410 B2 | 12/2011 | Rebstock |
| 8,088,203 B2 | 1/2012 | Matsuba |
| 8,146,623 B2 | 4/2012 | Tieben et al. |
| 8,161,985 B2 | 4/2012 | Moran et al. |
| 8,186,927 B2 | 5/2012 | Okabe et al. |
| 8,418,733 B2 | 4/2013 | Shikata et al. |
| 8,689,812 B2 | 4/2014 | Shah et al. |
| 8,753,063 B2 | 6/2014 | Rebstock |
| 8,764,370 B2 | 7/2014 | Rebstock |
| 8,777,540 B2 | 7/2014 | Rebstock et al. |
| 8,828,141 B2 | 9/2014 | Sakai et al. |
| 2003/0000470 A1 | 1/2003 | Shinoda et al. |
| 2003/0115956 A1 | 6/2003 | Moehnke et al. |
| 2003/0115978 A1 | 6/2003 | Moehnke et al. |
| 2003/0190886 A1 | 10/2003 | Hirasawa et al. |
| 2004/0187451 A1 | 9/2004 | Suzuki et al. |
| 2006/0185692 A1 | 8/2006 | Moran et al. |
| 2006/0222478 A1 | 10/2006 | Wakabayashi |
| 2006/0260978 A1 | 11/2006 | Gregerson et al. |
| 2006/0288664 A1 | 12/2006 | Okabe et al. |
| 2006/0291982 A1 | 12/2006 | Tanaka |
| 2007/0286712 A1 | 12/2007 | Rebstock |
| 2007/0298331 A1 | 12/2007 | Shuen et al. |
| 2008/0030712 A1 | 2/2008 | Tokhtuev et al. |
| 2008/0177414 A1 | 7/2008 | Harel et al. |
| 2008/0204680 A1 | 8/2008 | Tieben et al. |
| 2009/0110518 A1 | 4/2009 | Rice et al. |
| 2009/0272461 A1 | 11/2009 | Alvarez et al. |
| 2010/0175781 A1 | 7/2010 | Kisakibaru et al. |
| 2010/0274513 A1 | 10/2010 | Matsuba |
| 2010/0294397 A1 | 11/2010 | Kishkovich et al. |
| 2010/0316467 A1 | 12/2010 | Ishibashi et al. |
| 2011/0114129 A1 | 5/2011 | Kishkovich et al. |
| 2011/0253591 A1 | 10/2011 | Lee et al. |
| 2012/0037522 A1 | 2/2012 | Chiu et al. |
| 2012/0067274 A1 | 3/2012 | Hara et al. |
| 2012/0325328 A1 | 12/2012 | Shah et al. |
| 2014/0116920 A1 | 5/2014 | Lee et al. |
| 2014/0305540 A1 | 10/2014 | Oyama et al. |
| 2015/0016941 A1 | 1/2015 | Rice et al. |

FOREIGN PATENT DOCUMENTS

| | | |
|---|---|---|
| JP | 06179472 | 6/1994 |
| JP | 09275089 | 10/1997 |
| JP | 11168135 | 6/1999 |
| JP | 11317442 | 11/1999 |
| JP | 2000340641 | 12/2000 |
| JP | 2000353738 | 12/2000 |
| JP | 2004008836 | 1/2004 |
| JP | 2004128428 | 2/2004 |
| JP | 2004527899 | 9/2004 |
| JP | 2003092345 | 10/2004 |
| JP | 2005513459 | 5/2005 |
| JP | 2005340332 | 12/2005 |
| JP | 2007297196 | 11/2007 |
| JP | 2008159734 | 7/2008 |
| JP | 2009249053 | 10/2009 |
| JP | 2010256170 | 11/2010 |
| JP | 2011507309 | 3/2011 |
| JP | 2011114319 | 6/2011 |
| JP | 2012245477 | 12/2013 |
| KR | 20100059712 | 6/2010 |
| TW | 320179 | 6/1995 |
| TW | 286991 | 2/2006 |

Storing carriers in a storage
60

Periodically or occasionally bringing a carrier to a decontamination chamber for decontaminating
61

Returning the decontaminated carrier back to the storage
62

Fig. 6A

Loading a carrier to a stocker load port
63

Transferring the carrier to a decontamination chamber for decontaminating
64

Storing the carrier in a storage of the stocker
65

Fig. 6B

Storing carriers in a storage of a stocker
66

Transferring the carrier to a decontamination chamber for decontaminating
67

Transferring the decontaminated carrier to a load port of the stocker
68

Fig. 6C

```
┌─────────────────────────────────────────┐
│  Transferring a carrier to a stocker    │
│                  90                     │
└─────────────────────────────────────────┘
                    ↓
┌─────────────────────────────────────────┐
│ Flowing nitrogen at a storage location in the stocker │
│                  91                     │
└─────────────────────────────────────────┘
                    ↓
┌─────────────────────────────────────────┐
│ Storing a carrier at the storage location, wherein the │
│ carrier is coupled to the nitrogen flow to flow nitrogen to │
│       the inner volume of the carrier   │
│                  92                     │
└─────────────────────────────────────────┘
```

Fig. 9A

```
┌─────────────────────────────────────────┐
│  Transferring a carrier to a stocker load port │
│                  93                     │
└─────────────────────────────────────────┘
                    ↓
┌─────────────────────────────────────────┐
│ Rotating a storage carousel of the stocker to an empty │
│              storage location           │
│                  94                     │
└─────────────────────────────────────────┘
                    ↓
┌─────────────────────────────────────────┐
│ Flowing nitrogen at the empty storage location │
│                  95                     │
└─────────────────────────────────────────┘
                    ↓
┌─────────────────────────────────────────┐
│ Transferring the carrier to the storage location, wherein │
│ the carrier is coupled to the nitrogen flow to flow nitrogen │
│        to the inner volume of the carrier │
│                  96                     │
└─────────────────────────────────────────┘
```

Fig. 9B

```
┌─────────────────────────────────────────┐
│ Storing carriers in a stocker carousel, wherein each │
│ carrier is coupled to a nitrogen flow to flow nitrogen to the │
│        inner volume of the carrier      │
│                  97                     │
└─────────────────────────────────────────┘
                    ↓
┌─────────────────────────────────────────┐
│ Rotating the storage carousel of the stocker to a desired │
│              carrier location           │
│                  98                     │
└─────────────────────────────────────────┘
                    ↓
┌─────────────────────────────────────────┐
│ Transferring the desired carrier to a stocker load port │
│                  99                     │
└─────────────────────────────────────────┘
```

Fig. 9C

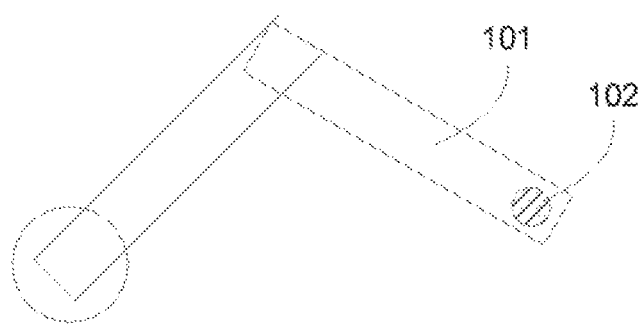
Fig. 10A
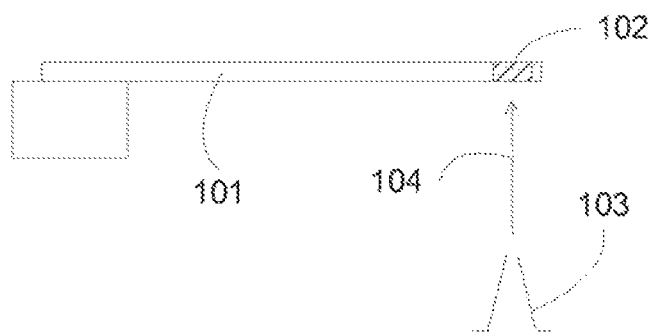
Fig. 10B
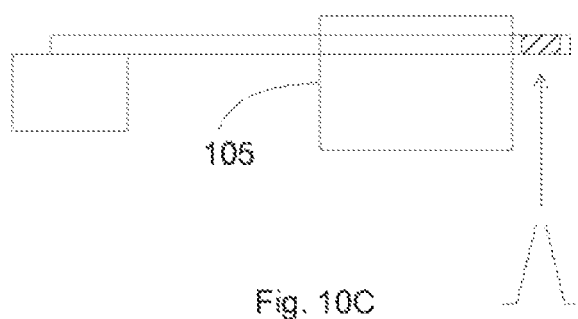
Fig. 10C
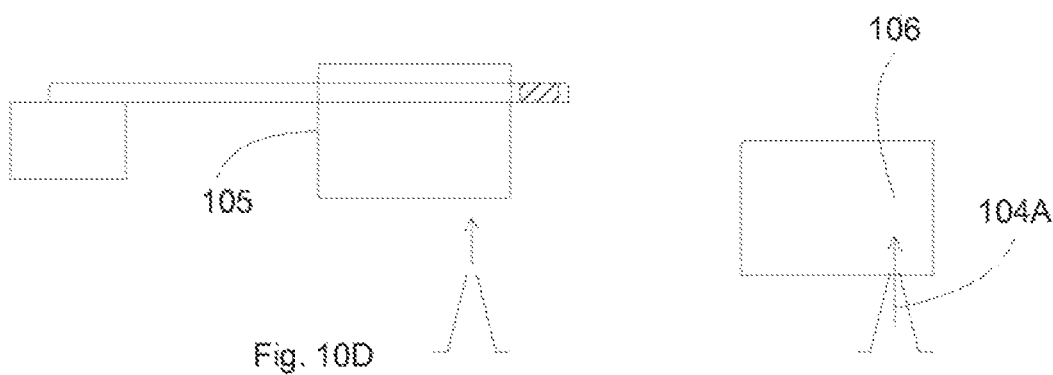
Fig. 10D
Fig. 10E Moving a robot arm to a storage location
130

Sensing, by a sensor on the gripper arm, a presence of a gas flow at the storage location
131

Identifying the storage location as having purge gas flow
132

Fig. 13A

Picking up, by a gripper arm, a carrier
133

Travelling to a desired storage location
134

On the path to the storage location, sensing, by a sensor on the gripper arm, a presence of a gas flow
135

Placing the carrier to the desired storage location, if detecting a gas flow, so that the gas flows to the inside of the carrier
136

If a gas flow is not detected, transferring the carrier to another storage location
137

Fig. 13B

Providing a carrier shelf
150

Coupling one or more sensors to the carrier shelf for collecting data related to ambient
151

Fig. 15A

Transferring a monitor carrier to an empty storage location in a stocker
152

Collecting data relating to the purge flow and other characteristics at the empty storage location
153

Fig. 15B

Transferring a monitor carrier to storage locations in a stocker
154

Collecting data relating to the purge flow and other characteristics at the storage locations in the stocker
155

Correlating data relating to the purge flow with respect to time and locations
156

Fig. 15C

Rotating a carrier support so that the carrier can be accessed by a OHT arm (optional)
180

Receiving a carrier on the carrier support by a OHT arm
181

Rotating the carrier support so that the carrier faces a central robot arm
182

Moving the robot arm to appropriate height level (optional)
183

Picking up the carrier by the robot arm
184

Fig. 18A

Rotating a carrier support to face a central robot arm (optional)
185

Placing a carrier on the carrier support by the robot arm
186

Rotating the carrier support so that the carrier can be accessed by a OHT arm
187

Moving the robot arm to appropriate height level (optional)
188

Receiving a carrier in a OHT station
189

Fig. 18B

SEMICONDUCTOR STOCKER SYSTEMS AND METHODS

This application is a continuation of U.S. patent application Ser. No. 13/537,016, filed on Jun. 28, 2012, (now U.S. Pat. No. 9,524,892), which claims priority from and the benefit of U.S. Provisional Patent Application No. 61/501,792, filed on Jun. 28, 2011, the disclosures of which are incorporated herein by reference in their entireties.

This invention relates to apparatuses and methods for storing workpieces or workpiece containers, such as wafer or reticle carriers used in the semiconductor fabrication industry.

BACKGROUND

Stockers generally are installed within a semiconductor facility for temporarily storing workpieces, such as wafers, flat panel displays, LCD, photolithography reticles, or masks. In the process of manufacturing semiconductor devices, LCD panels, and others, there are hundreds of processing equipments and thus hundreds of manufacturing steps. It is very difficult for the flow of the wafers, flat panels, or LCDs (hereafter workpiece) to be uniform from step to step, from tool to tool. Despite the best planners, there is always the unexpected scenario, such as a tool down, an emergency lot coming through, a periodic maintenance lasting longer than planned, thus there are various accumulations of the workpieces at certain steps for certain tools. The accumulated workpieces will need to be stored in a storage stocker, waiting to be processed.

For example, photolithography process is a critical process in the semiconductor fabrication facility, involving a large number of photolithography masks or reticles (hereafter reticle). The reticles thus are typically stored in a storage stocker, and being retrieved when needed into the lithography exposure equipment.

The storage of workpieces and reticles (hereafter articles) is much more complicated due to the requirement of cleanliness. Damages to the articles can be physical damages in the form of particles, or chemical damages, in the form of interactions. With the critical dimension of the semiconductor device processing surpassing 0.1 micron, particles of 0.1 micron size, and reactive species will need to be prevented from approaching the articles. The storage areas typically would need to be even cleaner than the processing facility, to ensure less cleaning between processing.

Thus the stocker storage areas is typically designed to be sealed off from the outside environment, preferably with constant purging, and even with inert gas flow to prevent possible chemical reactions. Access to the storage areas is load-locked, to ensure isolation between the clean storage environment and the outside environment.

With advances in semiconductor devices and processing, the requirements for cleanliness in modern semiconductor factories rise, for example, increased requirements for cleanliness in storage stockers.

SUMMARY

In an embodiment, the present invention discloses cleaned storage processes and systems for high level cleanliness articles, such as extreme ultraviolet (EUV) reticle carriers. A decontamination chamber can be used to clean the stored workpieces. A purge gas system can be used to prevent contamination of the articles stored within the workpieces. A robot can be used to detect the condition of the storage compartment before delivering the workpieces. A monitor device can be used to monitor the conditions of the stocker.

BRIEF DESCRIPTION OF THE DRAWINGS

FIGS. 6A-6C illustrate flowcharts for decontaminating objects in a stocker using a decontamination chamber according to an embodiment of the present invention.

FIGS. 9A-9C illustrate flowcharts for storing objects using purge gas compartments according to an embodiment of the present invention.

FIGS. 10A-10E illustrate a robot arm having a flow sensor according to an embodiment of the present invention.

FIGS. 13A-13B illustrate flowcharts for sensing purge gas flow before placing objects according to an embodiment of the present invention.

FIGS. 15A-15C illustrate flowcharts for data collecting from a monitor carrier according to an embodiment of the present invention.

FIGS. 18A-18B illustrate exemplary flowcharts for accessing overhead leading stations according to an embodiment of the present invention.

DETAILED DESCRIPTION OF THE PREFERRED EMBODIMENTS

In some embodiments, the present invention discloses methods and apparatuses for storage of objects, such as semiconductor workpiece containers and reticles carriers. In an embodiment, the storage process can include a clean environment for storage with purge gas to inner volume of stored objects, and decontamination chamber for periodically clean the stored objects.

Cleanliness is a critical requirement fore semiconductor articles such as cassettes, FOUP, holders, carriers, etc. In cleaned storage, a clean environment maintains a level of cleanliness, such as reduction of particles in the range of few microns down to sub-micron levels and reduction of trace contaminants, organic, inorganic metals, native oxide and particles matters.

In an embodiment, the present invention discloses cleaned storage processes and systems for high level cleanliness articles such as extreme ultraviolet (EUV) reticle carriers. The following description uses EUV reticle carriers are example, but the invention is not so limited, and can be applied toward any objects having stringent cleanliness requirements, such as low particulate contaminations and low outgassing components.

Figure 20:
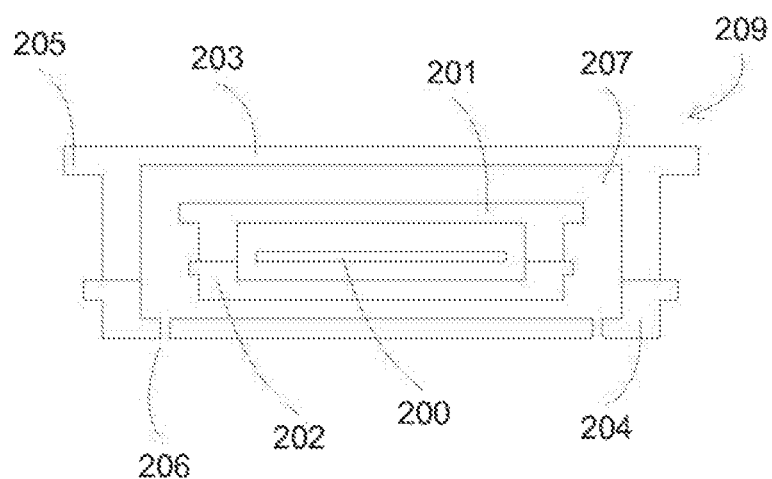
FIG. 20 illustrates a configuration of a EUV reticle carrier.

FIG. 20 illustrates a configuration of a EUV reticle carrier 209 to be stored. A EUV reticle 200 is typically stored in double-container carrier 209, together with having nitrogen in the space 207 between the inner container and the outer container. An inner container is typically made of metal, comprising an upper lid 201 mated with a lower support 202. An outer container is typically made of low outgassing can polymer, comprising an upper lid 203 mated with a lower support 204. Both containers can have handles for holding by an operator or by an automatic transport system. A handle 205 is shown for the upper lid 203 of the outer container. The support 204 of the outer container can have inlets for accepting nitrogen purge to the inner volume 207 of the reticle carrier.

The double container euv purge carrier is an example of the high level of cleanliness for semiconductor processing, where the reticle is stored in two levels of container to prevent contamination. In addition, the volume between the two levels is purged with nitrogen to avoid bacteria growth, or to prevent outgassing particles from the outer container to attach to the inner container. Thus a stored systems for such cleaned objects requires improved features to maintain the desired level of cleanliness.

In an embodiment, the present invention discloses a cleaning chamber and process to periodically purge, clean, or outgassing the stored objects. The cleaning chamber can restore the cleanliness of the stored object, for example, by outgassing any contaminants adhering to the objects during the storage. The periodic cleaning can reduce or eliminate any contamination, restoring the objects back to a high level of cleanliness.

In an embodiment, the cleaning chamber can include a decontamination chamber, employing high vacuum for performing outgassing of contaminants on the objects. The objects to be stored can undergo decontamination before placing into storage. The stored objects can be decontaminated before taken out of the stocker. The stored objects can be decontaminated following certain procedures, such as after a certain time, when the objects become dirty, or when there is some concern about the level of cleanliness for the stocker.

In an embodiment, the decontamination process employs high vacuum, such as at or lower than $10^{-6}$ Torr, to release any trapped contaminants on the surface or subsurface of the objects. In addition, the volume inside the objects can be evacuated, for example, at the same high vacuum level. Furthermore, purging processes can be performed to the inside volume, further removing any particulates and contaminants within the objects.

In an embodiment, the objects are decontaminated while being closed, with the inside volume pumped and/or pumped/purged with clean nitrogen. In another embodiment, the objects are decontaminated while being opened, thus all parts of the objects are subjected to a high level of vacuum for releasing any trapped contaminants.

Figure 1A:
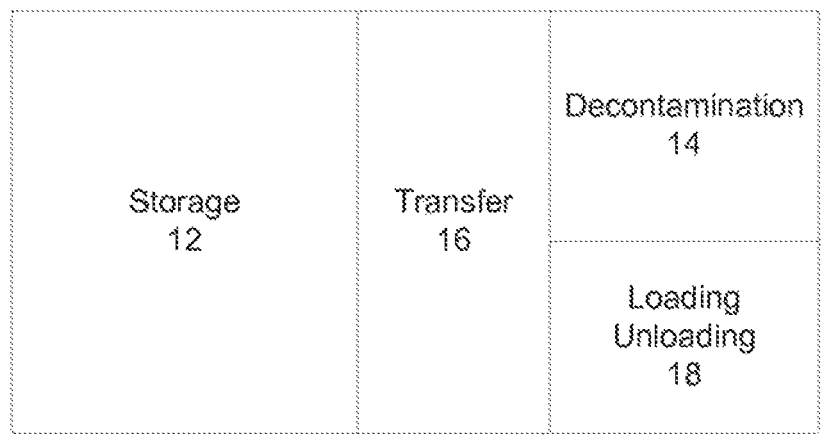
FIGS. 1A-1B illustrate configurations of a stoker system according to an embodiment of the present invention.
Figure 1B:
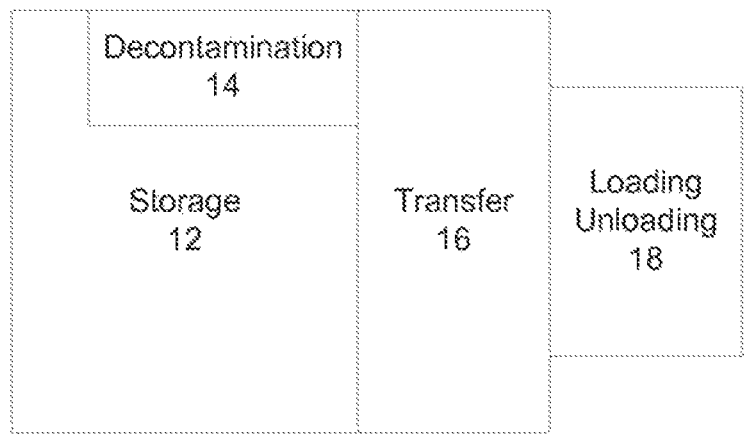

FIGS. 1A-1B illustrate configurations of a stocker systems according to an embodiment of the present invention. The stocker can include a storage chamber 12, a loading and unloading station 18, and a transfer system 16 for transferring objects between the loading/unloading station 18 and the storage chamber 12. In addition, the stocker can also include a decontamination chamber 14 for cleaning the stored objects. The decontamination chamber 14 can be located opposite (FIG. 1A) or next to the storage chamber 12 (FIG. 1B). Alternatively, the decontamination chamber 14 can be located anywhere within the stocker system, for example, within access of the transfer robot 16.

Figure 2A:
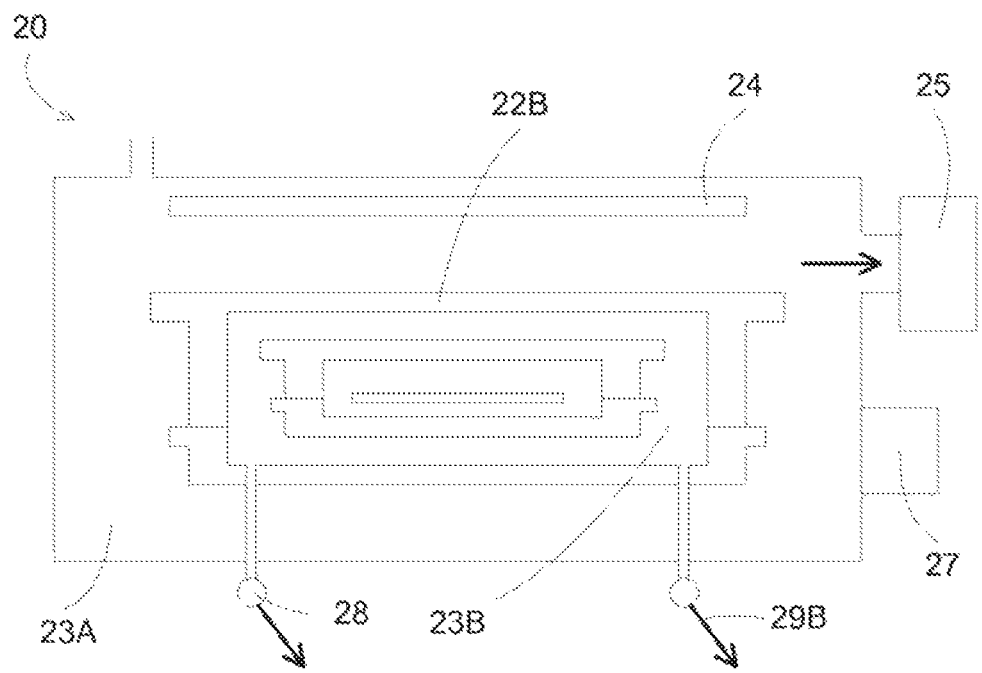
FIGS. 2A-2B illustrate an example of a decontamination process according to an embodiment of the present invention.
Figure 2B:
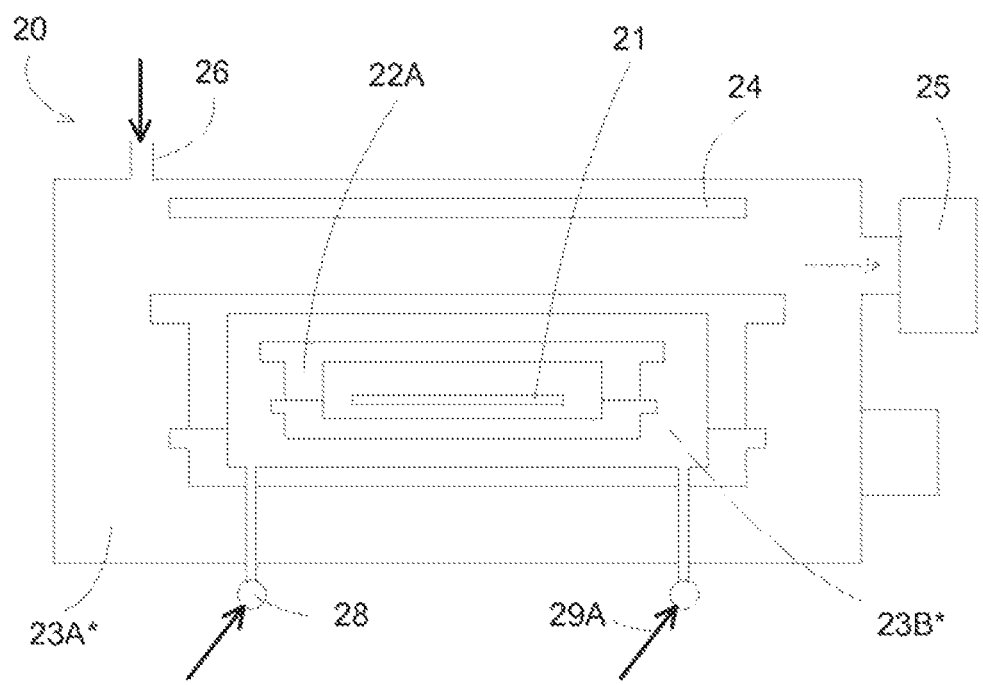

FIGS. 2A-2B illustrate an example of a decontamination process according to an embodiment of the present invention. The object shown to be decontaminated is a double container reticle carrier, including an outer container 22B and an inner container 22A protecting a reticle 21. The decontamination chamber 20 can include a vacuum pump 25 for maintaining a vacuum within the decontamination chamber 23A, a gas purge system 26 including a clean, inactive or inert gas such as nitrogen or compressed air for establishing a pressurized chamber, one or more manifolds 28 coupled to the inside volume of the objects, for example, volume 23B between the outer container 22B and the inner container 22A. The manifolds 28 are coupled to a pumping line 29B for evacuate the inside volume and a purge gas 29A for purging the inside volume. A heater 24 can be included for heating the object and/or the decontamination chamber. A sensor, such as a RGA (residue gas analyzer), can also be included to monitor levels of contamination of the object.

In FIG. 2A, a vacuum volume 23A is established by the vacuum pump 25 (for example, by shut down flow 26, together with a vacuum volume 23B inside the object, established by the manifolds 28 switching to pumping line 29B. Heater 24 and RGA 27 can be turned on. The time for decontamination can set predetermined, or can by set by the level of contaminants observed by the sensor 27. In FIG. 2B, after completing the vacuum decontamination, the vacuum is turned off, and the purge gas 26 is turned on to establish a pressurized environment 23A* in the decontamination chamber. Further, the manifolds 28 is switched to purged gas 29A to flowing purge gas to the inside volume 23B*. The pressurized ambient can be established before opening the decontamination chamber 20 to atmosphere, for example, before taking the object out of the decontamination chamber. The pressurized ambient can prevent back trapping of contamination chamber. The pressurized ambient can prevent back trapping of contaminants and particulates to the object surface.

In an embodiment, during vacuum decontamination phase (FIG. 2A), the manifolds 28 can be cyclically switching between pumping and purging, effectively performing pump/purge cycles to clean the inside volume 23B.

Figure 3A:
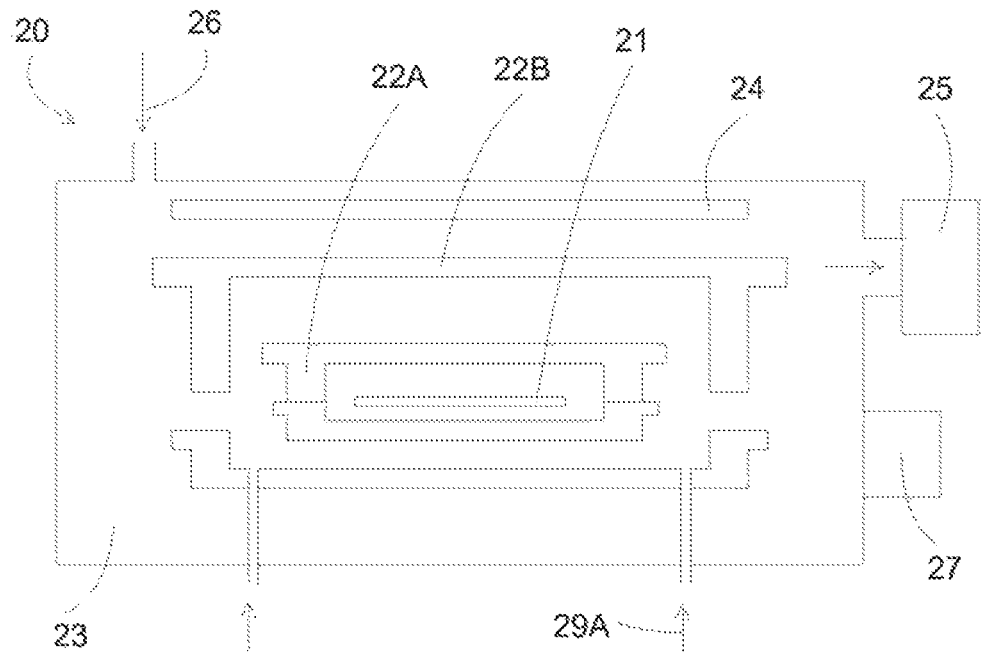
FIGS. 3A-3B illustrate different configurations for a decontamination system according to an embodiment of the present invention.
Figure 3B:
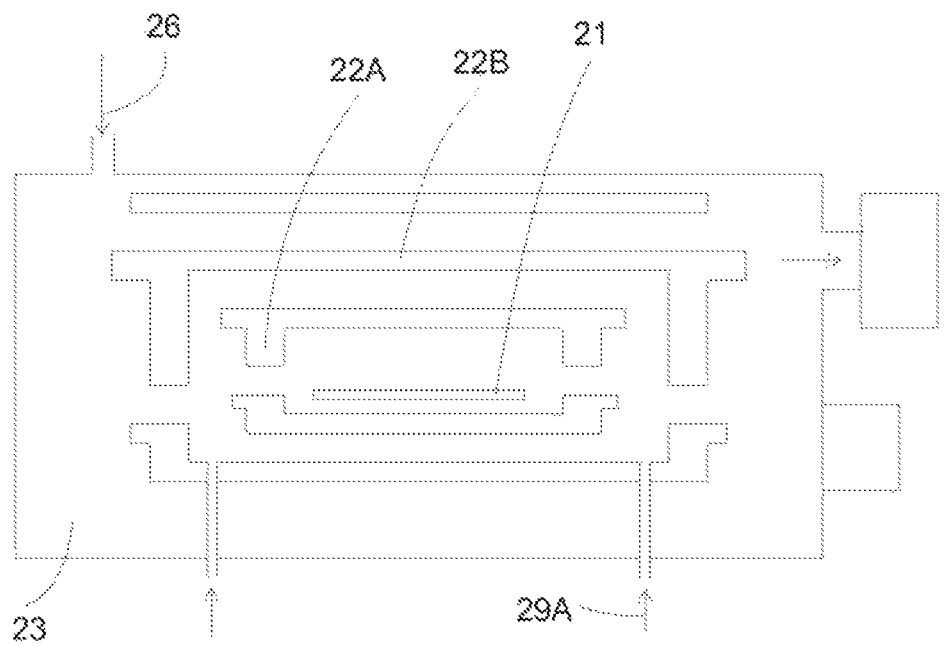

FIGS. 3A-3B illustrate different configurations for a decontamination system according to an embodiment of the present invention. In FIG. 3A, the outer container 22B is opened during decontamination. In this case, the manifolds 28 can be coupled directly to the purging line 29A, since the inside volume can be pumped through the decontamination chamber 23. Decontamination process is performed as before, with the vacuum providing outgassing process for the trapped contaminants, together with heater 24 and sensor 27. Purge gas is shut off, such as purge gas 26 for the chamber and purge 29A for the container. After completing the decontamination process, the purge gas 26 can be introduced to establish a pressurized ambient, in addition to the purge 29A for filling the inside volume. The outer container can be closed under the clean environment with the purge gas 29A, before the complete object released to the outside ambient.

In FIG. 3B, both inner and outer containers are opened during decontamination. The inner and outer containers are closed under purge gas ambient before releasing the closed object to the outside.

Figure 4A:
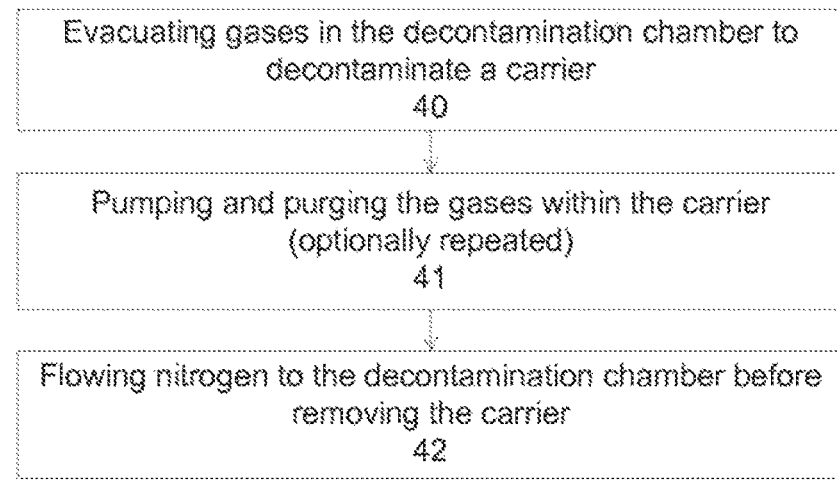
FIGS. 4A-4B illustrate flowcharts for decontaminating objects using a decontamination chamber according to an embodiment of the present invention.
Figure 4B:
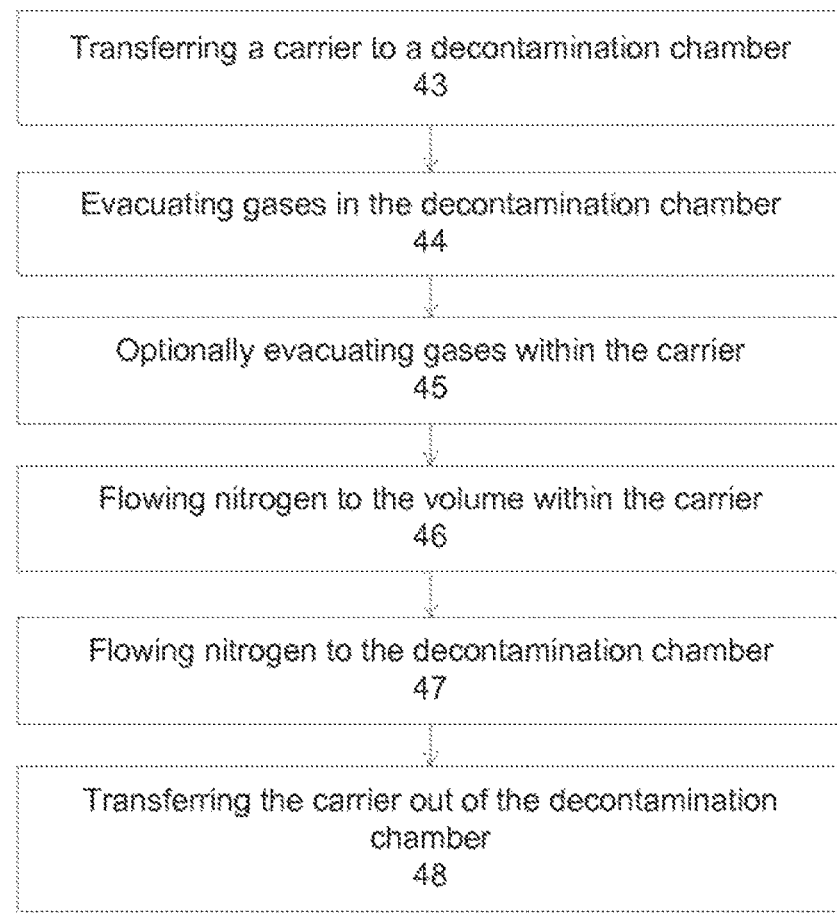

FIGS. 4A-4B illustrate flowcharts for decontaminating objects using a decontamination chamber according to an embodiment of the present invention. In an embodiment, the outside of the carrier is subjected to a vacuum outgassing process, and the volume within the carrier is subjected to a pumped/purge process. The pumped/purge process can be vacuum pumping for outgassing, which follows by a clean gas purge. Alternatively, the pumped/purge process can comprise multiple cycles of pumping and purging. In FIG. 4A, operation pumps and purges the gases within the carrier, one or multiple cycles. Operation 42 flows a nitrogen to the decontamination chamber before removing the carrier.

In an embodiment, the volume within the carrier is optionally pumped out. For example, if the time between decontamination is short, meaning the clean gas within the carrier is still very clean with minimal or negligible contaminants adhering to the object inside the inner volume, then an outgassing of the inner volume might not be needed. In most cases, the clean gas (e.g., nitrogen, within the carrier is replaced with a new clean gas, for example, by purge process of the inside volume. In FIG. 4B, operation 43 transfers a carrier to a decontamination chamber. Operation 44 evacuates gases in the decontamination chamber. Operation 45 optionally evacuates gases within the carrier. Operation 46 flows nitrogen to the volume within the carrier. Operation 47 flows nitrogen to the decontamination chamber. Operation 48 transfers the carrier out of the decontamination chamber.

Figure 5A:
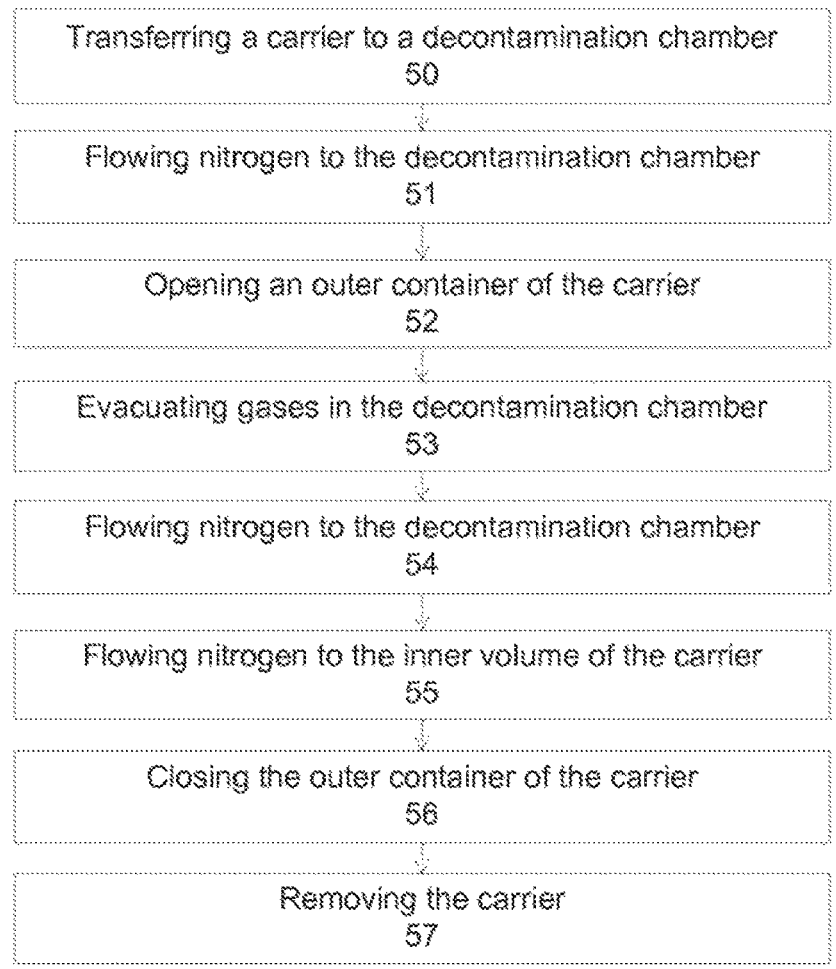
FIGS. 5A-5B illustrate other flowcharts for decontaminating objects using a decontamination chamber according to an embodiment of the present invention.
Figure 5B:
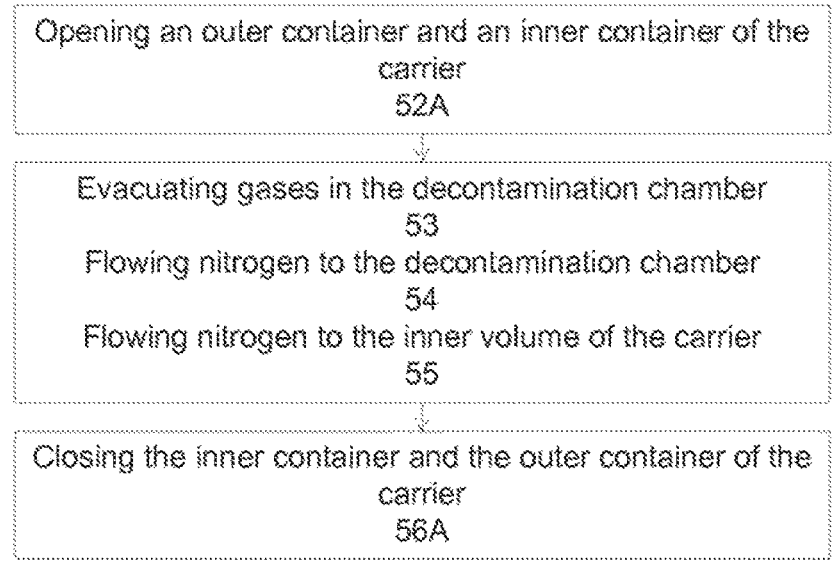

FIGS. 5A-5B illustrates other flowcharts for decontaminating objects using a decontamination chamber according to an embodiment of the present invention. In an embodiment, the carrier is opened for decontaminating the outside and the inside of the carrier. For example, an outer container is opened for decontaminating the volume between the outer and the inner volume. The innermost volume is still closed to protect the reticle. In FIG. 5A, operation 50 transfers a carrier to a decontamination chamber. Operation 51 flows nitrogen to the decontamination chamber. Operation 52 opens an outer container of the carrier. Operation 53 evacuates gases in the decontamination chamber. Operation 54 flows nitrogen to the decontamination chamber. Operation 55 flows nitrogen to the inner volume of the carrier. Operation 56 closes the outer container of the carrier. Operation 57 removes the carrier.

In embodiment, both outer and inner containers are opened for decontamination. Thus the above sequence can be used with operation 52 and 56 modified to 52A and 56A. In FIG. 5B, operation 52A opens an outer container and an inner container of the carrier. Operations 53 and 55 are similar with operation 53 evacuates gases in the decontamination chamber; operation 54 flows nitrogen to the decontamination chamber; and operation 55 flows nitrogen to the inner volume of the carrier. Operation 56A closes the inner container and the outer container of the carrier.

FIGS. 6A-6C illustrate flowcharts for decontaminating objects in a stocker using a decontamination chamber according the an embodiment of the present invention. In an embodiment, the objects stored in a stocker are periodically or occasionally brought to a cleaning chamber (such as a decontamination chamber) for cleaning or conditioning. In FIG. 6A, operation 60 stores carriers in a storage chamber. Operation 61 periodically brings a carrier to a decontamination chamber for decontaminating. Operation 62 returns the decontaminated carrier back to the storage.

In an embodiment, the object are cleaned or decontaminated before brought into the stocker. In FIG. 6B, operation 63 loads a carrier to a stocker load port. Operation 64 transfers the carrier to a decontamination chamber for decontaminating. Operation 65 stores the carrier in a storage of the stocker.

In an embodiment, the objects are cleaned or decontaminated before taken out of the stocker. In FIG. 6C, operation 66 stores carriers in a storage of a stocker. Operation 67 transfers the carrier to a decontamination chamber for decontaminating. Operation 68 transfers the decontaminated carrier to a load port of the stocker.

In some embodiments, the present invention discloses a decontamination chamber for decontaminating a workpiece. The workpiece can include a first container for storing an article. The first container can be stored within a second container. For example, the workpiece can be a carrier for a euv reticle. The decontamination chamber can include a support for supporting the workpiece. The support can include the wall of the chamber. The support can include a pedestal. The decontamination chamber can include a first pumping mechanism, wherein the first pumping mechanism is coupled to the decontamination chamber. The first pumping mechanism can include a pump, such as a turbo pump or a cryo pump. The pumping mechanism can include a high speed pumping system for fast throughput. The decontamination chamber can include a first gas delivery system for delivering an inactive gas to the decontamination chamber. The first delivery system can include a shut off valve to terminate the gas flow. The decontamination chamber can include a second pumping mechanism, wherein the second pumping mechanism is coupled to the workpiece, wherein the second pumping mechanism is configured to pump the volume between the first container and the second container. The decontamination chamber can include a second gas delivery system, wherein the second gas delivery system is coupled to the workpiece, wherein the second gas delivery system is configured to deliver an inactive gas to the volume between the first container and the second container. In some embodiments, the decontamination chamber can include nozzles that connect the workpiece to the second pumping system and the second delivery system, for example, through a manifold for switching between pumping and purging. The nozzles can protrude from the outside of the decontamination chamber to the inside of the decontamination chamber. For example, the nozzles can be couples to the support, so that the workpiece can be couples to the nozzles when placed on the support. Alternatively, the nozzles can be disposed anywhere within the decontamination chamber, and coupled to openings of the workpiece for pumping and purging. In some embodiments, the second pumping mechanism can be coupled to the nozzles to pump the volume between the first container and the second container. The second gas delivery system can be couple to the nozzles to deliver an inactive gas to the volume between the first container and the second container. A manifold can be provided, wherein the manifold is coupled to the nozzles for switching between delivering an inactive gas to the nozzles and to pumping through the nozzles. In some embodiments, the decontamination chamber can include a first mechanism for opening the second container, wherein the opening of the second container exposes the first container to the ambient of the second station. For example, the top portion of the second container can be raised up. The decontamination chamber can include a second mechanism for opening the first container, wherein the opening of the first container exposes the article to the ambient of the second station. For example, the top portion of the first container can be raised up.

In some embodiments, the present invention discloses a stocker for storing workpieces. The workpiece can include a first container for storing an article, wherein the first container is stored within a second container. The stocker can include a first station, wherein the first station is operable to load or unload a workpiece. The first station can be a loading station, an unloading station, or a station functioned as a loading and an unloading station. The stocker can include a second station, wherein the second station comprises a first pumping mechanism, wherein the first pumping mechanism is operable to establish a vacuum ambient within the second station can operate as a decontamination chamber, using the vacuum to outgas the surfaces of the workpiece. The stocker can include a storage chamber, wherein the storage chamber comprises a plurality of compartments for storing the workpieces. The stocker can include a third station, wherein the third station comprises a robot mechanism for transferring a workpiece between the first station, the second station, and the storage chamber.

In some embodiments, the second station can include a gas delivery system for delivering an inactive gas to the second station. The second station can include a gas delivery system for delivering an inactive gas to the volume between the first container and the second container. The second station can include on or more nozzles protruding from the outside of the second station to the inside of the second station, wherein the workpiece is coupled to the nozzles. The nozzles can be configured to deliver an inactive gas to the volume between the first container and the second container, or wherein the nozzles are configured to pump the volume between the first container and the second container. The second station can include a second pumping mechanism for pumping the volume between the first container and the second container. The second station can include a first mechanism for opening the second container, wherein the opening of the second container exposes the first container to the ambient of the second station, wherein the second station further comprises a second mechanism for opening the first container, wherein the opening of the first container exposes the article to the ambient of the second station.

In some embodiments, the present invention discloses a method for decontaminating a workpiece. The workpiece comprises a first container for storing an article. The first container can be stored within a second container. The method can include transferring the workpiece to a first station, wherein the first station is configured to decontaminate the workpiece. After the workpiece is disposed in the first station, a vacuum can be established within the first station. Further, the volume between the first container and the second container can be pumped. Then the outgassing of the workpiece is monitored, wherein the outgassing is caused by the vacuum ambient and by the pumping. After the workpiece is cleaned, for example, by the monitoring showing no or minimal contamination, such as the monitor shows a constant level of contamination, the workpiece can be removed from the first station. Before removing, an inactive gas is flown to the first station. An active gas is also flown to the volume between the first container and the second container. The inactive as can prevent cross contamination from ambient to the cleaned workpiece. Afterward, the workpiece can be transferred out of the first station.

In some embodiments, the method can include opening the first container and/or opening the second container during the decontamination process. The method can also include transferring the workpiece from a load port to the first station for decontamination before storage, transferring the workpiece from a storage chamber to the first station for decontamination after a certain time of storage or when taking the workpiece out of storage, transferring the workpiece from the first station to an unload port for taking out of the storage, transferring the workpiece from the first station to a storage chamber for store the workpiece after being cleaned.

The above description describes a stocker employing a decontamination chamber for cleaning stored objects. However, the present invention is not so limited, and can be equally applied to any cleaning chamber, such as cryogenic cleaning, gas blasting cleaning cryogenic particles blasting, laser cleaning, or supercritical liquid cleaning.

In an embodiment, the present invention discloses storage compartment having a purge gas system for keeping clean the inside volume of the stored objects. The purge gas system can deliver nitrogen to the inside of an object, effectively replacing the inside ambient, restoring the cleanliness level, and can eliminate or reduce particulate outgassing. For example, the volume between the outer container and the inner container of a double container euv reticle carrier is continuously (or intermittently) purged with nitrogen during storage, so that any contaminants outgassed from the outer container are removed and not adhering to the inner container.

In an embodiment, the storage chamber can be purged with a laminar flow for keeping the storage clean, preventing or reducing any contaminants from adhering to the outside of the carrier. For example, clean gas, such as compressed air after filtered, can be introduced to the storage chamber, either from a top portion, or from side portions to reduce or eliminate cross contamination.

In an embodiment, the purge gas can be recirculated, removing any chance if contamination from outside ambient. The recirculation gas can comprise inert gas such as nitrogen, or in active gas such as air. The recirculation gas can be filled to remove particulates, and can be cooled to reduce thermal motions. Thus the inside ambient of the storage compartment is isolated from the outside ambient, permitting a level of cleanliness suitable for the stored objects.

Figure 7:
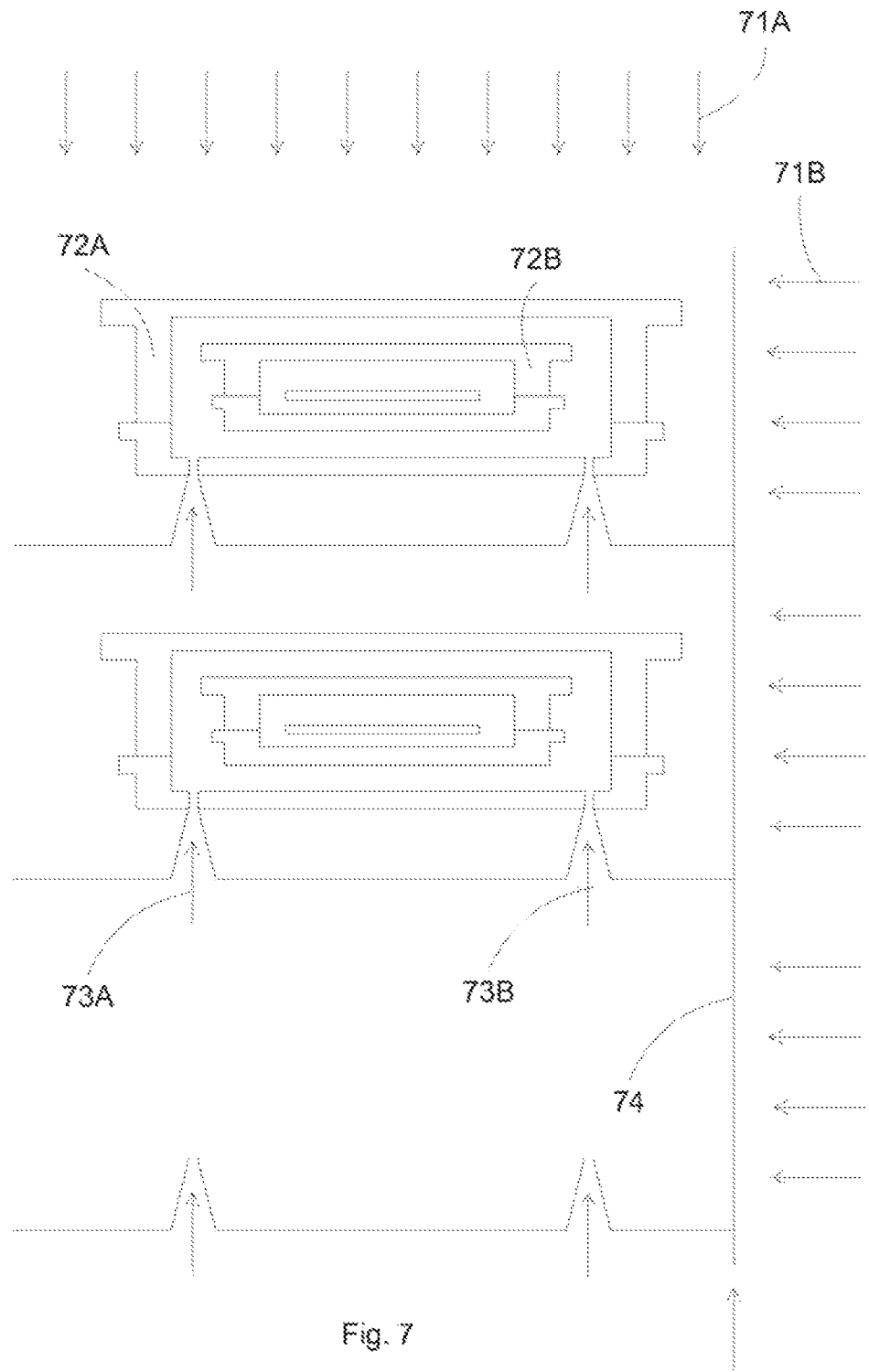
FIG. 7 illustrates a storage chamber including a number of storage compartments according to an embodiment of the present invention.

FIG. 7 illustrates a storage chamber including a number of storage compartments according to an embodiment of the present invention. A central gas line 74 delivers purge gas to the storage compartments. In an embodiment, the purge gas delivers 73A/73B purge gas continuously, without any active metering or controlling valves. The purge gas flow can be predetermined during fabrication, and can have optional metering valves for manual adjustment, same for all compartments or different for different compartments, but there can be no active or feedback controlling means. The purge gas can flow a fixed amount of gas, regardless of whether or not an object is located at the compartment. In another embodiment, the purge gas can be actively controlled, for example, to reduce the loss purge gas for compartment without any stored object.

The purge gas can deliver clean gas, such as nitrogen, to the inside volume of the stored object, such as the volume between an outer container 72A and an inner container 72B of a double container reticle carrier. Laminar flow (from outside ambient or from a recirculated ambient) can be delivered to the storage compartments, either for all compartments from top 71A (or from bottom, not shown), or from sides 71B for individual compartments.

Figure 8:
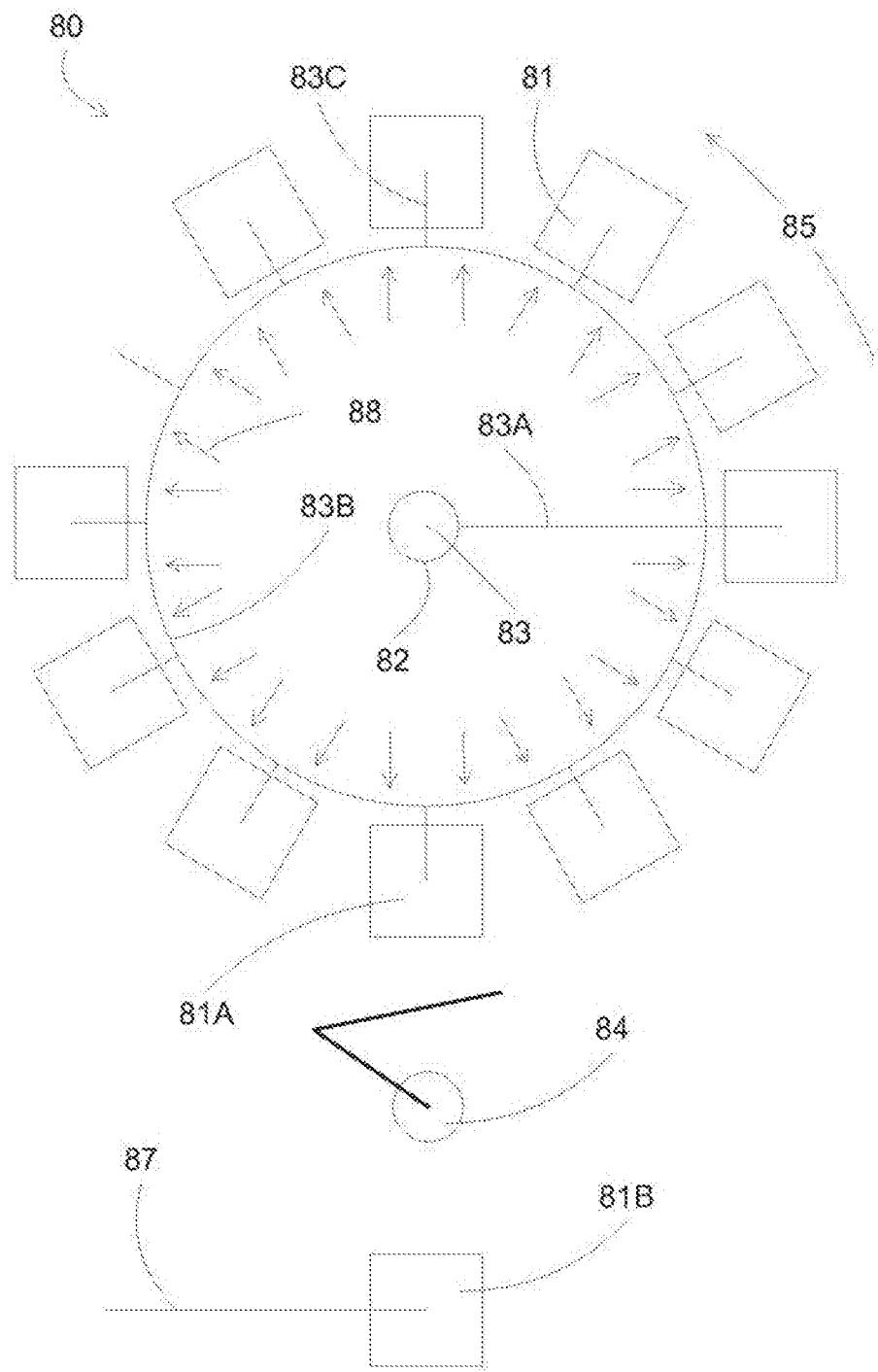
FIG. 8 illustrates a stocker system using purged gas storage compartments according to an embodiment of the present invention.

FIG. 8 illustrates a stocker system using purged gas storage compartments according to an embodiment of the present invention. An object, such as a double container carrier 81B, can be loaded to an input loading station, and can be transferred by a robot 84 to a storage compartment 81A of the stocker 80. In an embodiment, the storage chamber can include a carousel rotatable in a direction 85, so that an input/output compartment 81A is facing the robot 84.

Each storage compartment 81 can include a purge gas line 83C for purging an inside volume of the stored carrier. The purge gas can be delivered from a central line 83 to delivered line 83A, distributed to a ring 83B, and then provided to the storage compartments. Since the carousel is rotatable, a rotating seal, such as a ferro fluid seal 82, can be coupled between a fixed input line 83 to a rotating line 83A/83B/83C. Laminar flow 88, either filtered ambient gas or filtered recirculated gas, is provided to the storage compartments. In an embodiment, the input loading station is provided with purge gas line 87, to purge the inside volume of the carrier 81B at the loading position.

Similar processes can be used for removing a carrier from the storage compartments to the loading/unloading station.

FIGS. 9A-9C illustrate flowcharts for storing objects using purge gas compartments according to an embodiment of the present invention. In an embodiment, the carriers can be stored in locations having purge gas to the inside volume of the carriers. In FIG. 9A, operation 90 transfers a carrier to a stocker. Operation 91 flows nitrogen at a storage location in the stocker. Operation 92 stores a carrier at the storage location, wherein the carrier is coupled to the nitrogen flow to flow nitrogen to the inner volume of the carrier.

In an embodiment, each compartment can have a purge gas, and each carrier can be loaded to the stocker at a location having a purge gas. In FIG. 9B, a carrier can be transferred to a storage compartment in the stocker through a rotation of the storage carousel. Operation 93 transfers a carrier to a stocker load port. Operation 94 rotates a storage carousel of the stocker to an empty storage location. Operation 85 flows nitrogen at the empty storage location. Operation 86 transfers the carrier to the storage location, wherein the carrier is coupled to the nitrogen flow to flow nitrogen to the inner volume of the carrier.

In an embodiment, each compartment can have a purge gas, and each carrier can be unloaded to the load port. In FIG. 9C, a carrier can be transferred to the unload port through a rotation of the storage carousel. Operation 97 stores carriers in a stocker carousel, wherein each carrier is coupled to a nitrogen flow to flow nitrogen to the inner volume of the carrier. Operation 98 rotates the storage carousel of the stocker to a desired carrier location. Operation 99 transfers the desired carrier to a stocker load port.

In some embodiments, the present invention discloses a stocker for storing workpieces. The workpieces can include a first container for storing an article. The first container can be stored within a second container. The stocker can include a first station, wherein the first station is operable to load or unload a workpiece; a storage chamber, wherein the storage chamber comprises a plurality a compartments for storing the workpieces; a second station, wherein the second station comprises a robot mechanism for transferring a workpiece between the first station and the storage chamber; a gas delivery system, wherein the gas delivery system is distributed to one or more nozzles in each compartment of the storage chamber, wherein the nozzles are configured to couple to a workpiece stored in the each compartment to deliver an inactive gas to the volume between the first container and the second container of the workpiece.

In some embodiments, the gas delivery system delivers the inactive gas to the nozzles with or without a workpiece coupling to the nozzles. In some embodiments, the stocker can include a mechanism to deliver the inactive gas to the nozzles when a workpiece is coupled to the nozzles; a metering valve coupled to the nozzles to control a flow rate of the inactive gas through the nozzles; a flow mechanism for delivering a laminar flow to the compartments, wherein the laminar flow is provided from the top of the storage chamber; a flow mechanism for delivering a laminar flow to the compartments, wherein the laminar flow is provided from a side of each individual compartment; a circulation mechanism coupled to a raised floor for circulating a flow within the storage chamber; and a chiller for cooling the gas within the storage chamber.

In some embodiments, the stocker can include a first station, wherein the first station is operable to load or unload a workpiece; a first gas delivery system, wherein the first gas delivery system is coupled to one or more first nozzles in the first station, wherein the first nozzles are configured to couple to a workpiece positioned in the first station to deliver an inactive gas to the volume between the first container and the second container of the workpiece; a storage chamber, wherein the storage chamber comprises a plurality of compartments for storing the workpieces, wherein the compartments are disposed on a rotatable carousel; a second station, wherein the second station comprises a robot mechanism for transferring a workpiece between the first station and the storage chamber; a second gas delivery system, wherein the gas delivery system is distributed to one or more nozzles in each compartment of the storage chamber through a rotating seal, wherein the rotating seal is configured to couple the second gas delivery system to the rotatable carousel, wherein the nozzles are configured to couple to a workpiece stored in the each compartment to deliver an inactive gas to the volume between the first container and the second container of the workpiece.

In some embodiments, the stocker can include a flow mechanism for delivering a laminar flow to the compartments, wherein the laminar flow is provided from a side of each individual compartment; a circulation mechanism coupled to a raised floor for circulating a flow within the storage chamber, a chiller for cooling the gas within the storage chamber; and a decontamination chamber, wherein the decontamination chamber is operable to decontaminate the workpiece.

In some embodiments, the present invention discloses a method for storing a workpiece. The workpiece can include a first container for storing an article. The first container can be stored within a second container. The method can include transferring the workpiece to a compartment of a storage chamber, wherein the workpiece is coupled to one or more nozzles, wherein the nozzles are configured to deliver an inactive gas to the volume between the first container and the second container of the workpiece; flowing an inactive gas to the nozzles.

In some embodiments, the method can further include accepting the workpiece to a load port before transferring the workpiece from the load port the compartment, wherein the workpiece is coupled to one or more second nozzles in the load port, wherein the second nozzles are configured to deliver an inactive gas to the volume between the first container and the second container of the workpiece; flowing an inactive gas to the second nozzles; flowing an inactive gas to the nozzles with or without a workpiece coupling to the nozzles; flowing an inactive gas to the nozzles when a workpiece is coupled to the nozzles; delivering a laminar flow to the compartment; delivering a circulating flow to the compartment through a raised floor; and delivering the circulating flow through a chiller.

In an embodiment, the present invention discloses a robot arm to handle the object during transfer between the storage chamber and the load port. The robot can include a flow sensor for detecting a purge gas at a storage compartment before storing the object at the location. In an embodiment, the detection can be performed on-the-fly, meaning during the path to the storage compartment, thus incurring no transfer overhead. In an embodiment, the detection can be performed in a separate action, detecting the presence of a purge flow before selecting the storage compartment.

In an embodiment, a sensor can be used to each purge gas, thus for multiple purge gas system, the robot arm can detect any number of defected purge gas nozzles. The sensor can be positioned to be directly over the purge gas nozzle, thus can reliably detect the presence of gas flow. In an embodiment, the sensor is positioned at an offset from the purge gas nozzle, for example, when the robot arm is gripping the outer edge of the carrier and the purge gas nozzles are disposed inside the outer edge area.

In an embodiment, a gripper handler with gripper arms can be used to handle the stored objects, such as the double container carriers. For example, the gripper arm can handle the outer container. Alternatively, a gripper arm can handle an overhead handle, designed for overhead transport system.

FIGS. 10A-10E illustrate a robot arm having a flow sensor according to an embodiment of the present invention. A robot arm 101 can have a flow sensor 102 disposed at an end are of the robot arm, thus can detect a flow 104 during a robot arm movement, and before the carrier 105 reaches the gas nozzle 103. After detecting the presence of a gas flow at the desired location, the robot arm can continue its movement forward, stop when the carrier reaches the nozzles 103. The robot then can place the carrier 105 on the purge gas nozzle, allowing purge gas 104A from the nozzle to enter the inside volume 106 of the carrier 105. If a purge gas flow is not detected, the robot arm can move to another storage compartment, and optionally labeling this location this location as having defected purge gas. The detection can be performed during the path to the desired storage location, this incurring no overhead, and the throughput of the stocker can remain essentially the same, despite the additional action of detecting purge gas flow.

Figure 11A:
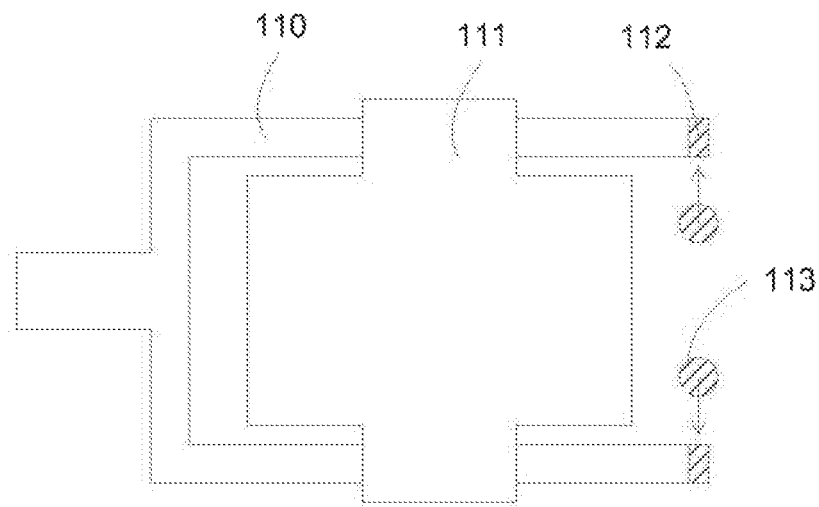
FIGS. 11A-11B illustrate sensor configurations on the gripper arms according to an embodiment of the present invention.
Figure 11B:
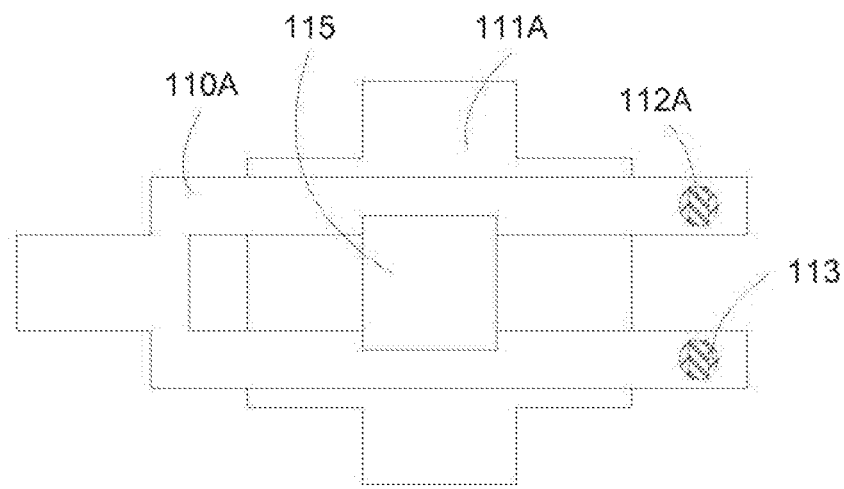

FIGS. 11A-11B illustrate sensor configurations on the gripper arms according to an embodiment of the present invention. In an embodiment, the sensor can be located at the front end of the robot arm, such as the gripper arm, so that the sensor can detect the flow before the carrier reaches the gas nozzle. In FIG. 11A, the gripper arms 110 can grip a carrier 111 by the edge. Sensor 112 can be disposed at the tips of the gripper arms 110, and can detect a side flow from nozzles 113 when the gripper arms moving past the gas nozzles 113. In an embodiment, the gripper arms can move so that the carrier 111 is aligned with the gas nozzles 113. In that movement direction, the flows from the nozzles can be offset with the sensors 112. Alternatively, the gripper arms can move to detect the flow, and then adjust the movements to align the carrier with the nozzles.

In an embodiment, the sensors can be disposed alignedly with the nozzles during the movement path. In FIG. 11B the gripper arms 110A can grip the carrier 11A at an overhead handle 115, and therefore the sensors 112A can be directly on top of the nozzles 113 when the gripper arms move to place the carrier 111A on the nozzles 113.

Figure 12A:
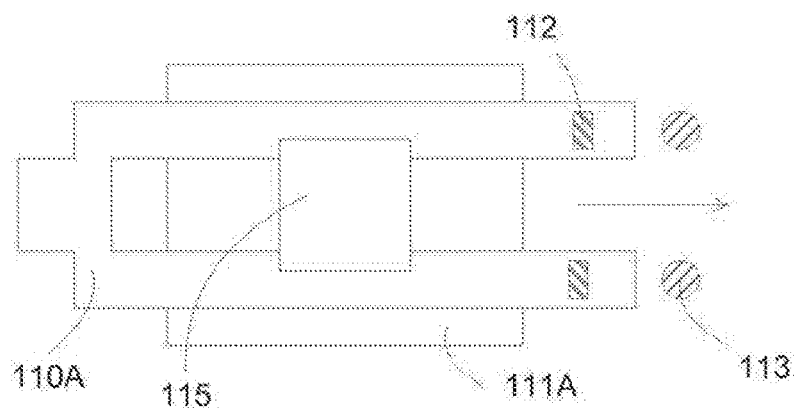
FIGS. 12A-12D illustrate a flow detection sequence according to an embodiment of the present invention.
Figure 12B:
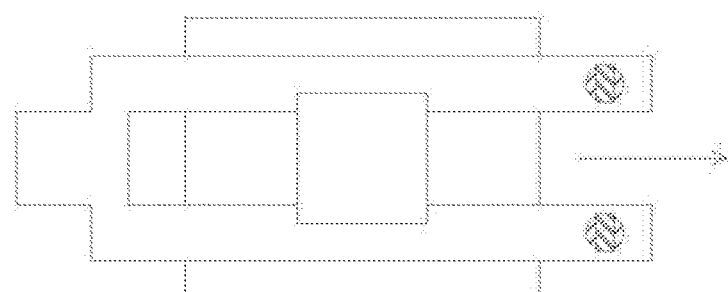
Figure 12C:
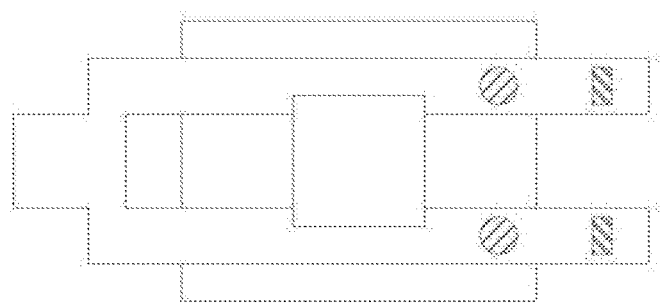
Figure 12D:
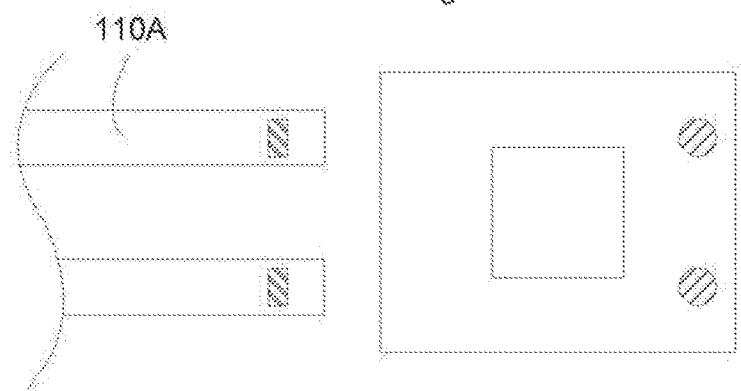

FIGS. 12A-12D illustrate a flow detection sequence according to an embodiment of the present invention. The sequence shows gripper arms 110A gripping a carrier 111A at a top handle 115. Sensors 112 can be located at the ends of the gripper arms 110A. FIG. 12A shows the gripper arms 110A on the path to the place the carrier 111A on the storage location so that the carrier mates with the purge nozzles 113. On the movement path, the sensors 112 can be on top of the flow nozzles 113, and thus can detect whether or not a flow exists (FIG. 12B). Other configurations are also possible, depending on the locations of the sensors, the flow nozzles and the path of the gripper arms. Upon detecting the presence of at least one flow (or all two flows, depending on flow requirements for purging carriers), the gripper arms can continue the path, stopping when the nozzles are aligned with the carrier (FIG. 2C). After alignment, the gripper arms can place the carrier at the storage location, allowing the nozzles to provide purge gas to the inside volume of the carrier. The gripper arms can then withdraw (FIG. 12D).

This sequence described a possible configuration of detecting nozzle flow on the path to place carrier. Other configurations can be used, such as detecting side flow, moving to detect nozzle flow before correcting the path for carrier placement.

FIGS. 13A-13B illustrate flowcharts for sensing purge gas flow before placing objects according to an embodiment of the present invention. In FIG. 13A, a robot arm can detect the present of a gas flow suitable for storing objects. The flow identification can be integrated to the object placement operation, identifying flow on the path of object placement. Operation 130 moves a robot arm to a storage location. Operation 131 senses, by a sensor on the gripper arm, a presence of a gas flow at the storage location. Operation 132 identifies the storage location as having purge gas flow.

In FIG. 13B, a sequence of object placement can be performed by a robot arm having one or more integrated sensors. Operation 133 picks up, by a gripper arm, a carrier. Operation 134 travels to a desired storage location. Operation 135 senses, on the path to the storage location, by a sensor on the gripper arm, a presence of a gas flow. Operation 136 places the carrier to the desired storage location, if detecting a gas flow, so that the gas flows to the inside of the carrier. Operation 137 transfers the carrier to another storage location if a gas flow is not detected.

In some embodiments, the present invention discloses a robot for transferring a workpiece. The robot can include a robot arm for supporting a workpiece; one or more sensors coupled to a first end of the robot arm, wherein the sensors are operable to detect a gas flow; a moving mechanism coupled to a second end of the robot arm, wherein the moving mechanism is operable to move the robot arm.

In some embodiments, the robot arm forms a gripper for gripping the workpiece. The robot can further include a mechanism for changing a gripping distance of the robot arm. The workpiece can be supported between the first end and the second end. The sensors can be configured to detect an upward gas flow. The sensors can be configured to detect a side gas flow. The sensors can be configured to detect the gas flow during a transfer of the workpiece to a destination.

In some embodiments, the present invention discloses a stocker for storing workpieces. The stocker can include a storage chamber, wherein the storage chamber comprises a plurality of compartments for storing the workpieces, wherein the storage chamber comprises one or more nozzles for delivering a gas flow; a robot for transferring a workpiece to or from the storage chamber, wherein the robot comprises one or more sensors coupled to an end of the robot arm, wherein the sensors are operable to detect a gas flow.

In some embodiments, the robot arm can form a gripper for gripping the workpiece. The robot can include a mechanism for changing a gripping distance of the robot arm. The workpiece can include a first container for storing an article, wherein the first container is stored within a second container, and wherein the second container comprises an inlet for accepting a gas flow flowing to the volume between the first container and the second container. The sensors can be configured to detect an upward gas flow. The sensors can be configured to detect a side gas flow. The sensors can be configured to detect the gas flow during a transfer of the workpiece to a compartment.

In some embodiments, the present invention discloses a method for transferring a workpiece. The method can include supporting a workpiece by a robot arm; transferring the workpiece to a compartment, wherein the compartment comprises a nozzle, wherein the nozzle is configured to deliver a gas flow; detecting the presence or absence of the gas flow during the transferring of the workpiece to the compartment; placing the workpiece to the compartment so that the nozzle is coupled to the workpiece if the gas flow is detected.

In some embodiments, after a sensor at an end of a robot arm detects the presence of a gas flow, the robot can continue to move to place the workpiece to the compartment, wherein the workpiece is supported at a middle of the robot arm. The gripper, formed by the robot arm, can be released to place the workpiece to the compartment.

In some embodiments, the methods can further include transferring the workpiece to another compartment is the gas flow is not detected; marketing the compartment as defective if the gas flow is not detected; transferring the workpiece to a load port, wherein the load port comprises a nozzle, wherein the nozzle is configured to deliver a gas flow; detecting the presence or absence of the gas flow during the transferring of the workpiece to the load port; placing the workpiece to the compartment so that the nozzle is coupled to the workpiece if the gas flow is detected.

In embodiment, the present invention discloses a monitor object, which can be made of similar size and shape as objects to be stored in a stocker. The monitor object can travels different storage locations to collect data relating the different storage locations, with respect to time and positions. For example, the monitor object can moves to different locations, identifying the purge gas flow characteristics at different locations within the stocker. In addition, the monitor object can collect data related to time, providing a time evolution of the purge gas characteristics.

In an embodiment, the monitor carrier can monitor the behavior of the purge gas, such as whether or not a purge gas is present, what the purge gas flow is, the quality of the purge gas, the composition of the purge gas, the level of particles in the purge gas, and any other characteristics of the purge gas.

In embodiment, the monitor carrier can monitor the behavior of the environment, such as the clean gas flow in the storage chamber. The monitor carrier can detect the quality of the storage ambient, such as the particle generation rate, the contaminant generation rate, the flow rate, and any other characteristics of the ambient. Other data can also be collected, such as temperature, cleanliness, particulates, etc.

Figure 14A:
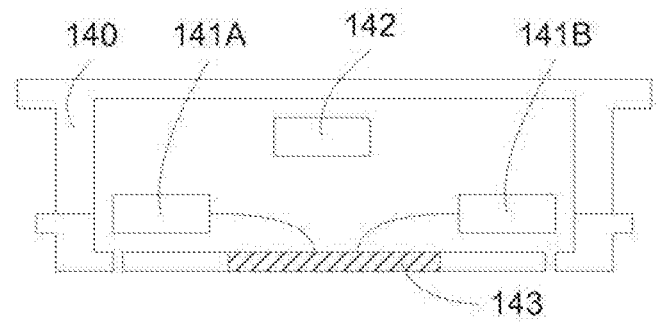
FIG. 14A illustrates a monitor carrier according to an embodiment of the present invention.

FIG. 14A illustrates a monitor carrier according to an embodiment of the present invention. The monitor carrier 140 can have a shape and size similar to other carriers, including handles to be picked up and released by a robot arm, and bottom surface to be placed on compartment support. The monitor carrier can comprise a battery 142 to power the electronics. The battery can be a rechargeable battery, but other battery types can ne used. The monitor carrier can include one or more sensors 141A and 141B, for sensing a purge flow in the inside volume or to sense an outside ambient characteristics. The sensors can communicate through interface 143, for example, to load instructions and to unload data.

Figure 14B:
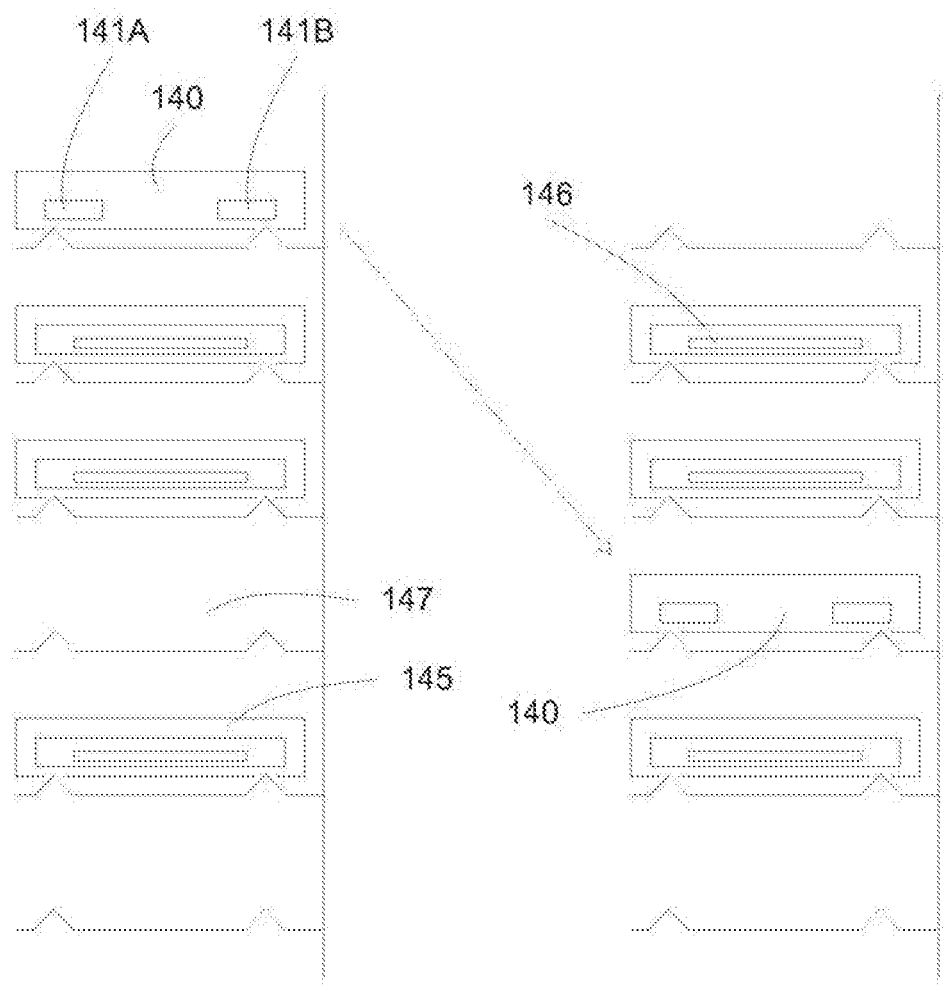
FIG. 14B illustrates movements of the monitor carrier is a stocker.

FIG. 14B illustrates movements of the monitor carrier is a stocker. In an embodiment, the monitor carrier can be used during operation of the stocker, with a number of stored carriers 145 having reticles 146. The monitor carrier 140 can be placed in an empty location, collecting data at the location. Afterward, the monitor carrier can be moved to a new location, either another empty location 147, or a location made empty by moving the occupied carrier to another location.

By moving the monitor carrier, location dependant data can be collected. For example, by correlating with the robot movements, the collected data can be attributed to different locations in the stocker. Further, time dependant data can also be provided, for example, by correlating the data with a time stamp or with the robot movements.

FIGS. 15A-15C illustrate flowcharts for data collecting from a monitor carrier according to an embodiment of the present invention. In FIG. 15A, one or more sensors can be coupled to a carrier shelf for collecting data. Operation 150 provides a carrier shelf. Operation 151 couples one or more sensors to the carrier shelf for collecting data related to ambient.

In FIG. 15B, data can be collected at empty locations in a stocker. Operation 152 transfers a monitor carrier to am empty storage location in a stocker. Operation 153 collects data relating to the purge flow at the empty storage location.

In FIG. 15C, collected data can be correlated with respect to time and positions. Operation 154 transfers a monitor carrier to storage locations in a stocker. Operations 155 collects data relating to the purge flow at the storage locations in the stocker. Operation 156 correlates data relating to the purge flow with respect to time and locations.

In some embodiments, the present invention discloses a device for monitor conditions of a stocker, with the stocker configured to store a plurality of workpieces. The device can include one or more sensors coupled to the outside surface or the inside of the device, wherein the device comprises similar size and shape of a workpiece; a memory coupled to the sensors for storing data collected by the sensors; a battery coupled to the memory to power the memory.

In some embodiments, a sensor can be configured to detect a gas flow. A sensor can be configured to detect a quality of a gas flow. A quality of a gas flow can include at least one of a composition of the gas flow, and a level of particles in the gas flow. A sensor can be configured to detect a characteristic of the ambient. The characteristic can include at least one of temperature, cleanliness, and level of particulates. The sensors can collect data as a function of time. A controller can be included to operate the sensors and the memory. An interface can be included for the sensors to communicate with a data processing system.

The above description describes a monitor carrier for used in a storage stocker. However, the invention is not so limited, and can be used for other systems, such as cleaner systems or processing systems to monitor system characteristics under operating conditions.

In an embodiment, the present invention discloses a station within a system for accepting a monitor carrier. The station can provide interfaces to the monitor carrier, for example, to transfer data and power. In an embodiment, the station can include a mating interface, for mating with the interface of the monitor carrier. Through the interface, power, for example, to charge a rechargeable battery in the monitor carrier, and data, for example, to transfer collected data or to accept instructions, can be transferred between the station and the monitor carrier. The station can be coupled to an electronic subsystem of the system, so that the data can be processed.

Figure 16A:
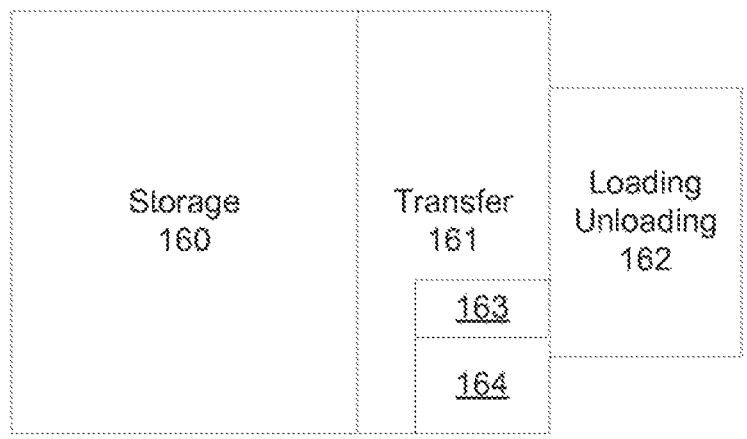
FIG. 16A illustrates a system including a data collection station according to an embodiment of the present invention.

FIG. 16A illustrates a system including a data collection station according to an embodiment of the present invention. A stocker can include storage chamber 160, a transfer module 161, loading and unloading station 162, control equipment 164, and a data collection station 163. The transfer module can transfer one or more monitor carriers throughout the storage chamber 160, and to and from the data collection station 163 for battery recharging and data transferring. From the data collection station, data can be transferred to the electronic equipment, to be further processed and displayed.

In an embodiment, the present invention discloses a stocker for storing workpieces. The stocker can include a storage chamber, wherein the storage chamber comprises a plurality of compartments for storing the workpieces, wherein the storage chamber comprises one or more nozzles for delivering a gas flow; robot for transferring a workpiece to or from the storage chamber; a station, wherein the station is operable to support a workpiece, wherein the station comprises an interface for mating with a device, wherein the device comprises a size and shape similar to the workpiece.

In some embodiments, a controller can be coupled to the mating interface for processing data from the device. The device can collect data related to the stocker and to transfer to the interface. The data can include at least one of a presence of a gas flow, a quality of a gas flow and a characteristic of the ambient. A quality of a gas flow can include at least one of a composition of the gas flow, and a level of particles in the gas flow. The characteristic can include at least one of temperature, cleanliness, and level of particulates. The device can collect data as a function of time to transfer to the interface.

Figure 16B:
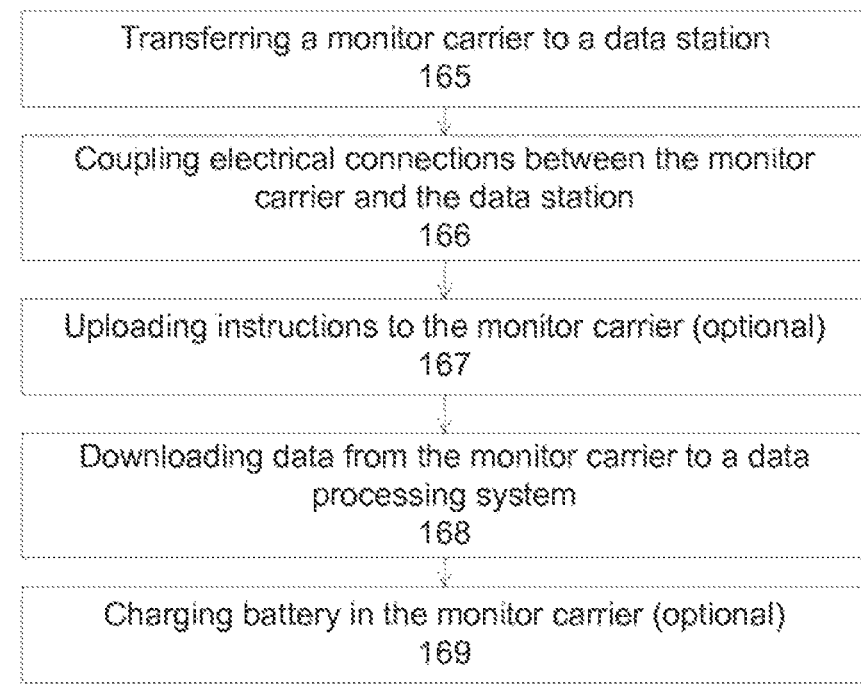

FIG. 16B illustrates a flowchart for data collection station according to an embodiment of the present invention. Operation 165 transfer a monitor carrier to a data station. Operation 166 couples electrical connections between the monitor carrier and the data station. Operation 167 uploads instructions to the monitor carrier (optional). Operation 168 downloads data from the monitor carrier (optional).

In some embodiments, the present invention discloses a method for monitoring conditions of a stocker, wherein the stocker is configured to store a plurality of workpieces. The method can include transferring a device to a storage compartment of the stocker, wherein the device comprises a size and shape similar to the workpiece, wherein the device is configured to be transferred by the same mechanism as the workpiece, wherein the device is configured to be disposed in a storage compartment as the workpiece; collecting data relating to a gas flow or an ambient by the device; transfer the device to another storage compartment.

In some embodiments, the method can include picking up the deice from a station, wherein the station comprises an interface for transferring data from the device; recharging a battery of the device at a station. The data relating to a gas flow or an ambient can include at least one of a quality of a gas flow, a composition of the gas flow, a level of particles in the gas flow, a characteristic of the ambient, a temperature, a cleanliness, and a level of particulates.

In an embodiment, the present invention discloses a loading station for overhead transport (OHT). Overhead transport typically runs overhead, connecting different process equipment within a fabrication facility. The overhead transport is also typically linear, running straight lines from one equipment to another equipment. Thus the overhead transport loading stations are normally linear, perpendicularly interfacing the overhead transport line. In contrast, the manual loading stations are typically radially positioned, interfacing a central point where a robot arm is located.

In an embodiment, the present invention discloses methods and systems to rotate the objects in an overhead transport loading/unloading station, from a linear orientation to a radial orientation, facing a central robot ar. In an embodiment, the overhead loading station is disposed at a higher position than the normal loading station. A same robot can be used to access both manual loading stations and overhead loading stations, with the robot travelling a vertical direction connecting the two loading stations. With the overhead loading stations re-oriented to face the central robot, accessing the objects in the overhead loading stations can be simplified.

Figure 17:
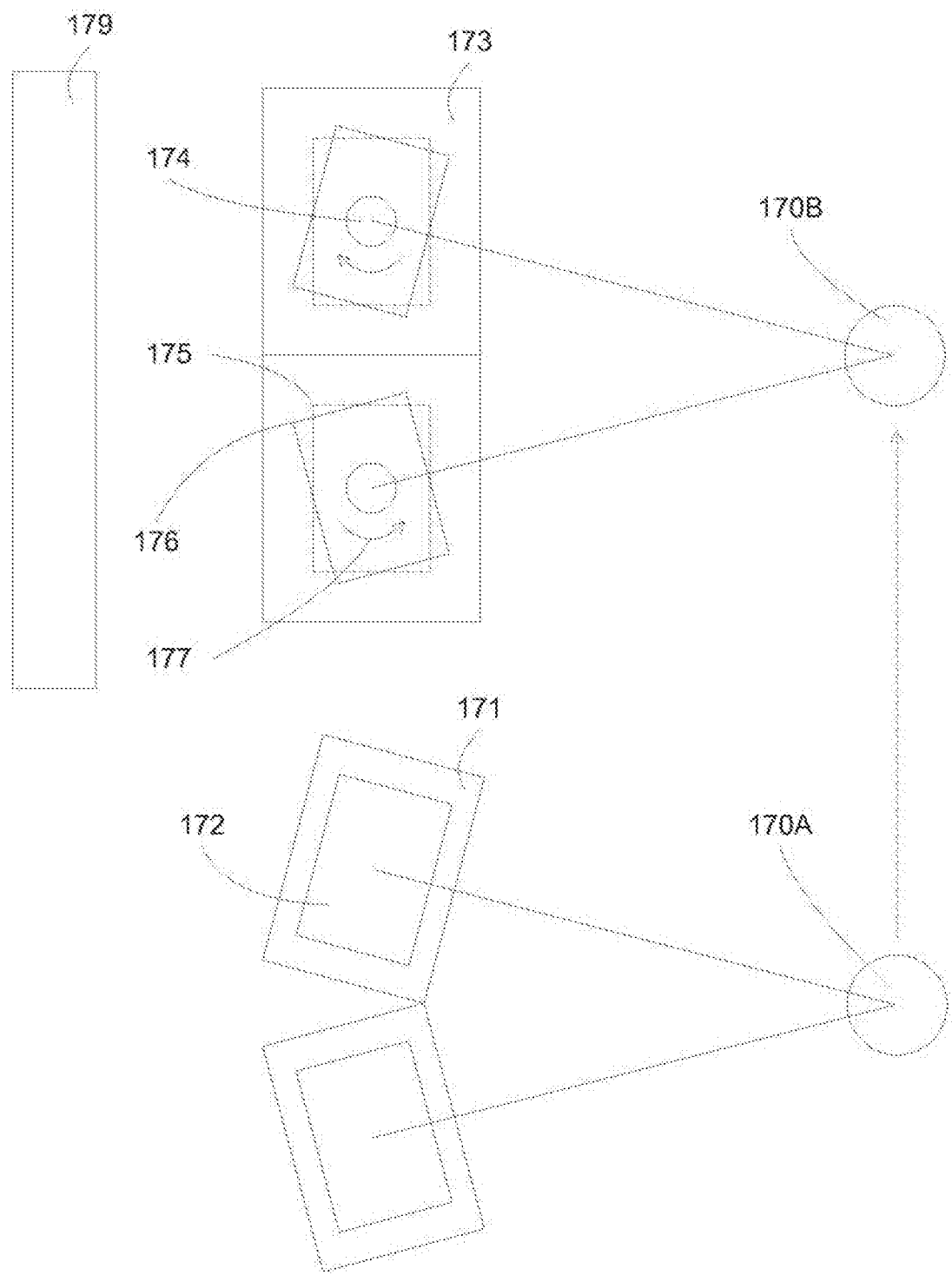
FIG. 17 illustrates an exemplary configuration for overhead and manual loading stations according to an embodiment of the present invention.

FIG. 17 illustrates an exemplary configuration for overhead and manual loading stations according to an embodiment of the present invention. Manual loading/unloading stations 171 and corresponding objects 172 are radially designed, facing the central robot 170A at the height of the manual loading stations. Overhead loading/unloading stations 173 are linearly designed to accommodate overhead transport line 179. After transferring from the overhead transport line 179, the objects are linearly oriented 175. The overhead loading stations comprise a rotational mechanism 174, rotating 177 the objects to radially face the robot 170B. As shown, the left and right objects are rotated in different directions. Other rotational directions are included, depending on the positions of the linear transport line and the position of the central robot. Thus to access the objects, the robot moves in the z-direction from the manual loading station to the overhead loading station, the objects rotate from linear positions to radial positions, and the robot can access the rotated objects.

FIGS. 18A-18B illustrate exemplary flowcharts for accessing overhead loading stations according to an embodiment of the present invention. In FIG. 18A, a robot moves up and carrier rotated to be oriented radially to be picked up by the robot. Operation 180 rotates a carrier support so that the carrier can be accessed by a OHT arm (optional). Operation 181 receives a carrier on the carrier support by OHT arm. Operation 182 rotates the carrier support so that the carrier faces a central robot arm. Operation 183 moves the robot arm to appropriate height level (optional). Operation 184 picks up the carrier by the robot arm.

In FIG. 18B, robot moves up and places carrier on loading station. Loading station is then rotated to be oriented linearly to be picked up by the overhead transport. Operation 185 rotates a carrier support to face a central robot arm (optional). Operation 186 places a carrier on the carrier support by the robot arm. Operation 187 rotates the carrier support so that the carrier can be accessed by a OHT arm. Operation 188 moves the robot arm to appropriate height level (optional). Operation 189 receives a carrier in a OHT station.

In an embodiment, the present invention discloses loading and unloading station for a cleaner system with nitrogen purge to the volume inside volume is constantly purged with inert gas such as nitrogen. Thus the present invention discloses an inert gas purge for a transfer and/or storage station, ensuring a constant purge of the inside volume.

Figure 19:
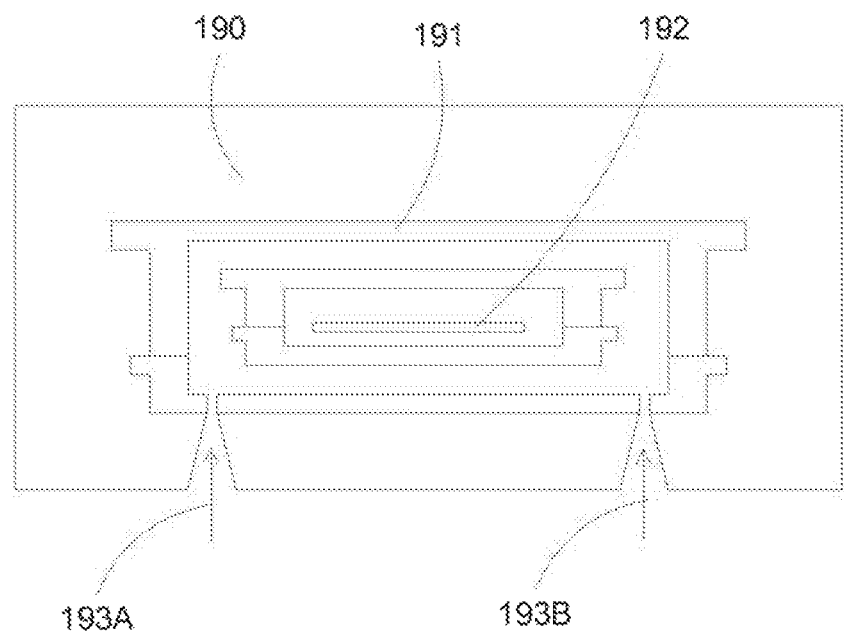
FIG. 19 illustrates an exemplary transfer and/or storage station having purge nozzles according to an embodiment of the present invention.

FIG. 19 illustrates an exemplary transfer and/or storage station having purge nozzles according to an embodiment of the present invention. The double container carrier 190 is placed on nitrogen purge nozzles 194 in the station 192. With the nitrogen nozzles 194 providing nitrogen 195 to the bottom support of the double container carrier 190, the volume inside the outer container is constantly purged with refreshed nitrogen.

In an embodiment, the present invention discloses a EUV stocker system and process for storage of EUV carriers. The euv stocker system comprises one or more cleaning chambers (such as decontamination chambers), purge gas storage stations and compartments, robot arm having sensors for detecting purge gas operation, monitor carriers for data collection in the stocker, monitor station for data and power transfer, rotating overhead loading station, and purge gas loading and unloading station.

What is claimed is:

1. A stocker for storing multi-compartment workpieces, wherein the multi-compartment workpieces each comprise at least one compartment enclosing at least another compartment, the stocker comprising:
   a first station, wherein the first station is operable to load or unload the multi-compartment workpieces;
   a storage chamber, wherein the storage chamber comprises a plurality of storage compartments for storing the multi-compartment workpieces;
   a second station, wherein the second station comprises a robot mechanism for transferring the multi-compartment workpieces between the first station and the storage chamber;
   a compartment inerting system, wherein the compartment inerting system is coupled to an interior of the at least one compartment that encloses the at least another compartment of one of the multi-compartment workpieces stored in each storage compartment and configured so as to
   inert an enclosing volume defined between the at least one compartment of the multi-compartment workpiece and the at least another compartment of the multi-compartment workpiece.

2. The stocker of claim 1, wherein the compartment inerting system is distributed to one or more nozzles in each storage compartment of the storage chamber and wherein the one or more nozzles are configured to couple to the interior of the at least one compartment.

3. A stocker as in claim 2, wherein the compartment inerting system delivers an inactive gas to the one or more nozzles with the interior of the at least one compartment coupled to the one or more nozzles.

4. A stocker as in claim 2, further comprising a mechanism to deliver an inactive gas to the one or more nozzles when the interior of the at least one compartment is coupled to the one or more nozzles.

5. A stocker as in claim 2, further comprising: a metering valve coupled to the one or more nozzles to control a flow rate of an inactive gas through the one or more nozzles.

6. A stocker as in claim 1, further comprising: a flow mechanism for delivering a laminar flow to the plurality of storage compartments, wherein the laminar flow is provided from the top of the storage chamber.

7. A stocker as in claim 1, further comprising: a flow mechanism for delivering a laminar flow to the plurality of storage compartments, wherein the laminar flow is provided from a side of each individual storage compartment.

8. A stocker as in claim 1, further comprising: a circulation mechanism coupled to a raised floor of the storage chamber for circulating a flow within the storage chamber.

9. A stocker as in claim 1, further comprising: a chiller for cooling a gas within the storage chamber.

10. A stocker for storing multi-compartment workpieces, wherein the multi-compartment workpieces each integrally comprise at least one compartment enclosing a volume and at least another compartment connected to the at least one compartment, the stocker comprising:
    a first station, wherein the first station is operable to load or unload the multi-compartment workpieces;
    a storage chamber, wherein the storage chamber comprises a plurality of storage compartments for storing the multi-compartment workpieces;
    a second station, wherein the second station comprises a robot mechanism for transferring the multi-compartment workpieces between the first station and the storage chamber;
    a compartment inerting system, wherein the compartment inerting system is coupled to an interior of the at least one compartment that encloses the volume of one of the multi-compartment workpieces stored in each storage compartment and configured so as to
    inert the enclosed volume of the at least one compartment of the multi-compartment workpiece independent of the at least another compartment of the multi-compartment workpiece.

11. The stocker of claim 10, wherein the compartment inerting system is distributed to one or more nozzles in each storage compartment of the storage chamber and wherein the one or more nozzles are configured to couple to the interior of the at least one compartment.

12. A stocker as in claim 11, wherein the compartment inerting system delivers an inactive gas to the one or more nozzles with the interior of the at least one compartment coupled to the one or more nozzles.

13. A stocker as in claim 11, further comprising a mechanism to deliver an inactive gas to the one or more nozzles when the interior of the at least one compartment is coupled to the one or more nozzles.

14. A stocker as in claim 11, further comprising: a metering valve coupled to the one or more nozzles to control a flow rate of an inactive gas through the one or more nozzles.

15. A stocker as in claim 10, further comprising: a flow mechanism for delivering a laminar flow to the plurality of storage compartments, wherein the laminar flow is provided from the top of the storage chamber.

16. A stocker as in claim 10, further comprising: a flow mechanism for delivering a laminar flow to the plurality of storage compartments, wherein the laminar flow is provided from a side of each individual compartment.

17. A stocker as in claim 10, further comprising: a circulation mechanism coupled to a raised floor of the storage chamber for circulating a flow within the storage chamber.

18. A stocker as in claim 10, further comprising: a chiller for cooling a gas within the storage chamber.

19. The stocker of claim 10, wherein the at least another compartment is enclosed within the at least one compartment of the multi-compartment workpiece.

20. A stocker for storing multi-compartment workpieces, wherein the multi-compartment workpieces each comprise at least one outer compartment and at least one inner compartment connected to the at least one outer compartment, the stocker comprising:
   a first station, wherein the first station is operable to load or unload the multi-compartment workpieces;
   a storage chamber, wherein the storage chamber comprises a plurality of storage compartments for storing the multi-compartment workpieces;
   a second station, wherein the second station comprises a robot mechanism for transferring the multi-compartment workpieces between the first station and the storage chamber;
   a compartment inerting system, wherein the compartment inerting system is distributed to one or more nozzles in each storage compartment of the storage chamber, wherein the one or more nozzles are configured to couple to an interior of the at least one outer compartment that encloses the at least one inner compartment of one of the multi-compartment workpieces stored in each storage compartment and configured so as to inert an interior volume defined between the at least one outer compartment of the multi-compartment workpiece and the at least one inner compartment of the multi-compartment workpiece.

21. A stocker as in claim 20, wherein the compartment inerting system delivers an inactive gas to the one or more nozzles with the interior of the at least one outer compartment coupled to the one or more nozzles.

22. A stocker as in claim 20, further comprising a mechanism to deliver an inactive gas to the one or more nozzles when the interior of the at least one outer compartment is coupled to the one or more nozzles.

23. A stocker as in claim 20, further comprising: a metering valve coupled to the one or more nozzles to control a flow rate of an inactive gas through the one or more nozzles.

24. A stocker as in claim 20, further comprising: a flow mechanism for delivering a laminar flow to the plurality of storage compartments, wherein the laminar flow is provided from the top of the storage chamber.

25. A stocker as in claim 20, further comprising: a flow mechanism for delivering a laminar flow to the plurality of storage compartments, wherein the laminar flow is provided from a side of each individual storage compartment.

26. A stocker as in claim 20, further comprising: a circulation mechanism coupled to a raised floor of the storage chamber for circulating a flow within the storage chamber.

27. A stocker as in claim 20, further comprising: a chiller for cooling a gas within the storage chamber.

28. The stocker of claim 20, wherein the at least another compartment is enclosed in the at least one compartment of the multi-compartment workpiece.

* * * * *